(12) United States Patent
Lin et al.

(10) Patent No.: US 11,177,177 B2
(45) Date of Patent: Nov. 16, 2021

(54) SEMICONDUCTOR DEVICE AND METHOD OF MANUFACTURE

(71) Applicant: TAIWAN SEMICONDUCTOR MANUFACTURING COMPANY LIMITED, Hsin-Chu (TW)

(72) Inventors: Fo-Ju Lin, Keelung (TW); Chia-Wei Chang, Taichung (TW); Chiung Wen Hsu, Tainan (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 56 days.

(21) Appl. No.: 16/682,163

(22) Filed: Nov. 13, 2019

(65) Prior Publication Data

US 2020/0176322 A1   Jun. 4, 2020

Related U.S. Application Data

(60) Provisional application No. 62/773,356, filed on Nov. 30, 2018.

(51) Int. Cl.
| | |
|---|---|
| *H01L 21/8234* | (2006.01) |
| *H01L 21/308* | (2006.01) |
| *H01L 21/3065* | (2006.01) |
| *H01L 27/088* | (2006.01) |

(52) U.S. Cl.
CPC .. *H01L 21/823431* (2013.01); *H01L 21/3065* (2013.01); *H01L 21/3081* (2013.01); *H01L 27/0886* (2013.01)

(58) Field of Classification Search
CPC ......... H01L 21/823431; H01L 21/3081; H01L 21/3065; H01L 21/31116; H01L 21/3086; H01L 27/0886; H01L 29/66795; H01L 29/66545
USPC ........ 257/369, 368, 401, 506, 288, E21.038, 257/E21.214, E21.236, E21.546, E29.018, 257/E29.02, E29.255, E27.06; 438/423, 438/424, 700, 703
See application file for complete search history.

(56) References Cited

U.S. PATENT DOCUMENTS

| | | | |
|---|---|---|---|
| 8,546,202 B2 * | 10/2013 | Tung | .............. H01L 21/823431 438/151 |
| 9,378,973 B1 * | 6/2016 | Tung | .................. H01L 21/3086 |
| 9,397,006 B1 * | 7/2016 | Ok | ...................... H01L 27/0886 |
| 10,586,859 B2 * | 3/2020 | Wang | .................. H01L 21/3081 |

(Continued)

FOREIGN PATENT DOCUMENTS

| | | |
|---|---|---|
| CN | 105765703 A | 7/2016 |
| KR | 20080109762 A | 12/2008 |

(Continued)

*Primary Examiner* — Dao H Nguyen
(74) *Attorney, Agent, or Firm* — Cooper Legal Group, LLC

(57) ABSTRACT

A semiconductor device and method for forming the semiconductor device are provided. A first layer is formed over a semiconductor layer, and a first patterned mask is formed over the first layer. A cyclic etch process is then performed to define a second patterned mask in the first layer. The cyclic etch process includes a first phase to form a polymer layer over the first patterned mask and a second phase to remove the polymer layer and to remove a portion of the first layer. A portion of the semiconductor layer is removed using the second patterned mask to define a fin from the semiconductor layer.

20 Claims, 18 Drawing Sheets

(56) References Cited

U.S. PATENT DOCUMENTS

| | | | | |
|---|---|---|---|---|
| 2012/0032267 A1* | 2/2012 | Cheng | ............... | H01L 21/76237 257/368 |
| 2013/0328162 A1* | 12/2013 | Hu | ................ | H01L 29/861 257/526 |
| 2014/0256093 A1* | 9/2014 | Lin | ................ | H01L 29/6681 438/157 |
| 2016/0240537 A1 | 8/2016 | Chang et al. | | |
| 2016/0379888 A1* | 12/2016 | Chao | ................ | H01L 27/0886 438/283 |

FOREIGN PATENT DOCUMENTS

| | | | |
|---|---|---|---|
| KR | 20130139158 A | 12/2013 |
| KR | 20160100191 A | 8/2016 |
| KR | 20160115655 A | 10/2016 |
| TW | 201635352 A | 10/2016 |
| TW | 201715639 A | 5/2017 |
| TW | 201841246 A | 11/2018 |
| WO | 0024048 A1 | 4/2000 |
| WO | 2007094957 A1 | 8/2007 |

\* cited by examiner

SEMICONDUCTOR DEVICE AND METHOD OF MANUFACTURE

RELATED APPLICATION

This application claims priority to U.S. Provisional Application 62/773,356, titled "SEMICONDUCTOR ARRANGEMENT AND METHOD OF MANUFACTURE" and filed on Nov. 30, 2018, which is incorporated herein by reference.

BACKGROUND

As the semiconductor industry has progressed into nanometer technology process nodes in pursuit of higher device density, higher performance, and lower costs, challenges from both fabrication and design issues have resulted in the development of three dimensional designs, such as a fin-like field effect transistor (FinFET) and gate all around (GAA) transistors. A FinFET comprises an extended semiconductor fin that is elevated over a substrate in a direction substantially normal to a plane of a top surface of the substrate. A channel of the FinFET is formed in this fin. A gate is provided over and partially wraps the fin. A GAA transistor comprises one or more nano-sheet channel regions having a gate wrapped around the nano-sheet. FinFETs and GAA transistors can reduce short channel effect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
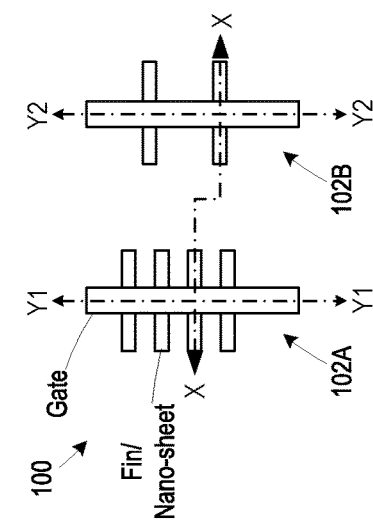
FIGS. 1-17 are illustrations of a semiconductor device at various stages of fabrication, in accordance with some embodiments.
Figure 1:
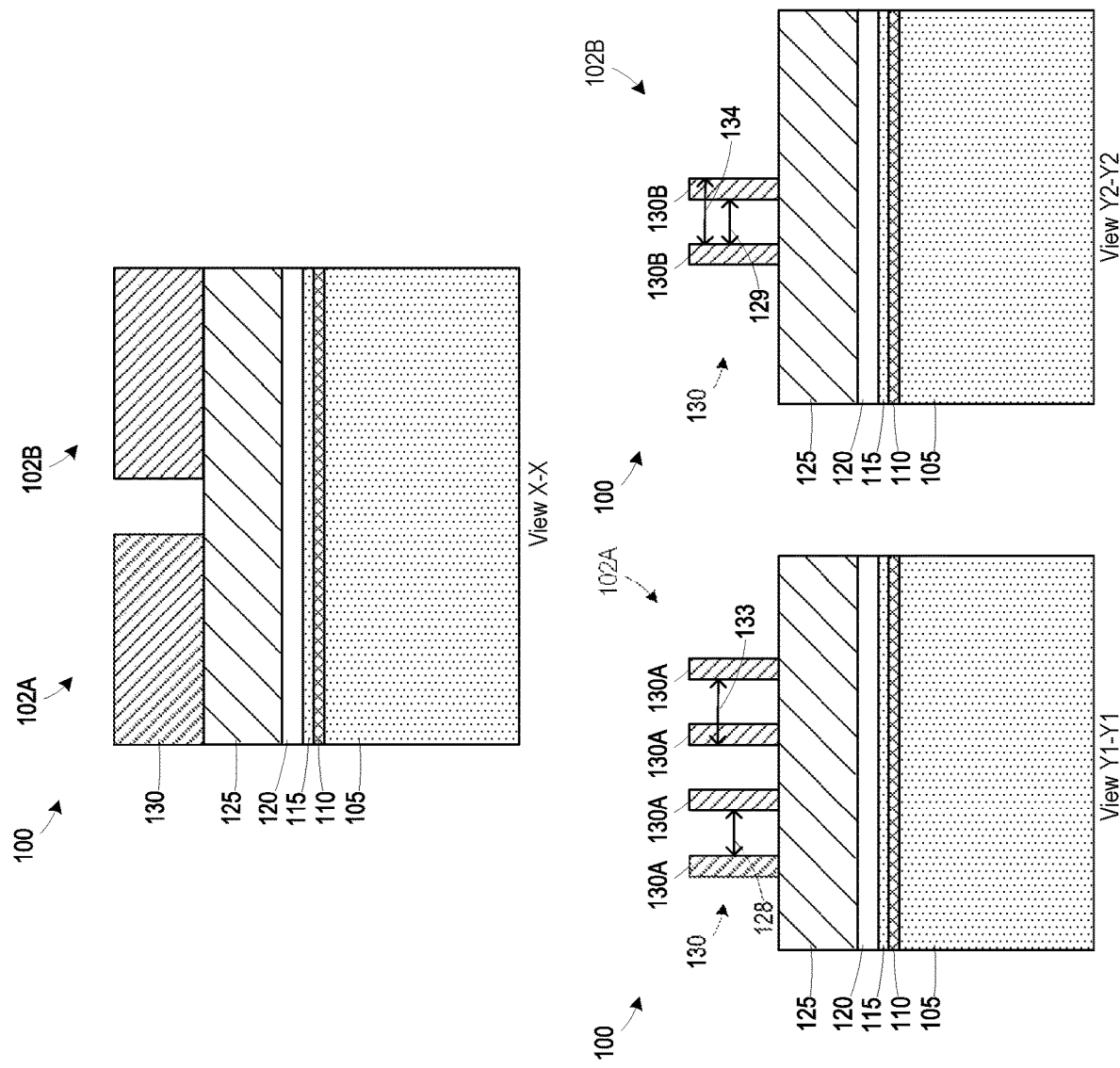

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly One or more techniques for fabricating a semiconductor device are provided herein. In some embodiments, a plurality of layers is provided over a layer to be patterned. In some embodiments, the layer to be patterned comprises a semiconductor layer in which fins are to be formed. In some embodiments, a first layer is formed over a semiconductor layer. In some embodiments, a first patterned mask is formed over the first layer. In some embodiments, the first patterned mask comprises elements corresponding to the fins to be formed in the semiconductor layer. In some embodiments, a cyclic etch process is performed to define a second patterned mask in the first layer. In some embodiments, the cyclic etch process comprises a first phase to form a polymer layer over the first patterned mask and a second phase to remove the polymer layer and to remove a portion of the first layer. In some embodiments, portions of the semiconductor layer are removed using the second patterned mask to define fins in the semiconductor layer. According to some embodiments, the cyclic etch process reduces fin critical dimension (CD) variation, fin tapering, and line width roughness, and makes the depth of the fins more uniform.

FIGS. 1-17 are illustrations of a semiconductor device 100 at various stages of fabrication, in accordance with some embodiments. FIGS. 1-16 include a plan view showing where various cross-sectional views are taken. Referring to FIG. 1, the view X-X is a cross-sectional view taken through the semiconductor device 100 in a direction corresponding to a gate length direction through fin structures, and the views Y1-Y1 and Y2-Y2 are cross-sectional views taken through the semiconductor device 100 in a direction corresponding to a gate width direction through gate structures. Not all aspects of the processing shown in the cross-sectional views will be depicted in the plan view. In some embodiments, the devices shown in view Y1-Y1 are formed in a first region 102A of the semiconductor device 100, and the devices shown in view Y2-Y2 are formed in a second region 102B.

According to some embodiments, the regions 102A, 102B have different device densities. In some embodiments, the different densities result from different pitches, different fin critical dimensions (CDs), or different fin array sizes. In some embodiments, such as illustrated in FIG. 1, the region 102A comprises a dense region, and the region 102B comprises a less dense region, at times referred to as an isolated region. In some embodiments, the region 102A comprises memory devices. In some embodiments, the region 102B comprises logic devices.

Referring to FIG. 1, a plurality of layers used in the formation of the semiconductor device 100 is illustrated, in accordance with some embodiments. In some embodiments, the semiconductor device 100 comprises fin-based transistors, such as FinFET transistors. In some embodiments, the semiconductor device comprises nano-sheet based transistors or gate-all-around (GAA) transistors. The plurality of layers is formed over a semiconductor layer 105. In some embodiments, the semiconductor layer 105 is part of a substrate comprising at least one of an epitaxial layer, a single crystalline semiconductor material such as, but not limited to Si, Ge, SiGe, InGaAs, GaAs, InSb, GaP, GaSb, InAlAs, GaSbP, GaAsSb, and InP, a silicon-on-insulator (SOI) structure, a wafer, or a die formed from a wafer. In some embodiments, the semiconductor layer 105 comprises crystalline silicon.

In some embodiments, a first layer 110 is formed over the semiconductor layer 105. In some embodiments, the first layer 110 comprises a fin-top hard mask. In some embodiments, the first layer 110 comprises silicon carbon nitride (SiCN) or other suitable hard mask material. In some embodiments, the first layer 110 is formed by using, for example, at least one of chemical vapor deposition (CVD), plasma-enhanced CVD (PECVD), low pressure CVD (LPCVD), ultrahigh vacuum CVD (UHVCVD), atomic layer CVD (ALCVD), physical vapor deposition (PVD), pulsed laser deposition (PLD), sputtering, evaporative deposition, vapor phase epitaxy (VPE), molecular beam epitaxy (MBE), liquid phase epitaxy (LPE), a spin-on technology, or other applicable techniques.

In some embodiments, a second layer 115 is formed over the first layer 110. In some embodiments, the second layer 115 comprises a semi-conductive layer, such as silicon or other suitable materials. In some embodiments, the second layer 115 is formed by using, for example, at least one of CVD, PECVD, LPCVD, UHCVD, ALCVD, PVD, PLD, sputtering, evaporative deposition, VPE, MBE, LPE, a spin-on technology, or other applicable techniques.

In some embodiments, a third layer 120 is formed over the second layer. In some embodiments, the third layer 120 comprises a hard mask material, such as silicon nitride or other suitable material. In some embodiments, the third layer 120 is formed by using, for example, at least one of CVD, PECVD, LPCVD, UHCVD, ALCVD, PVD, PLD, sputtering, evaporative deposition, VPE, MBE, LPE, a spin-on technology, or other applicable techniques.

In some embodiments, a fourth layer 125 is formed over the third layer 120. In some embodiments, the fourth layer 125 comprises an oxide, such as silicon dioxide or other suitable oxide. In some embodiments, the fourth layer 125 is formed by using, for example, at least one of CVD, PECVD, LPCVD, UHCVD, ALCVD, PVD, PLD, sputtering, evaporative deposition, VPE, MBE, LPE, a spin-on technology, or other applicable techniques.

In some embodiments, a first patterned mask 130 is formed over the fourth layer 125. In some embodiments, the first patterned mask 130 comprises a hard mask material, such as silicon nitride or other suitable hard mask material. According to some embodiments, the first patterned mask 130 is formed by forming a plurality of individually formed layers that together define a mask stack. In some embodiments, the mask stack comprises a hard mask layer formed over the fourth layer 125 by at least one of CVD, PECVD, LPCVD, UHCVD, ALCVD, PVD, PLD, sputtering, evaporative deposition, VPE, MBE, LPE, a spin-on technology, or other applicable techniques. In some embodiments, the hard mask layer comprises the hard mask material, such as silicon nitride or other suitable hard mask material. In some embodiments, the mask stack comprises a bottom antireflective coating (BARC) layer formed over the hard mask layer. In some embodiments, the BARC layer is a polymer layer that is applied using a spin coating process. In some embodiments, an organic planarization layer (OPL) is formed over the BARC layer. In some embodiments, the OPL comprises a photo-sensitive organic polymer that is applied using a spin coating process. In some embodiments, the OPL comprises a dielectric layer. According to some embodiments, the mask stack comprises a photoresist layer formed over the OPL. In some embodiments, the photoresist layer is formed by at least one of spinning, spray coating, or other applicable techniques. The photoresist layer comprises an electromagnetic radiation sensitive material, and properties, such as solubility, of the photoresist layer are affected by electromagnetic radiation. The photoresist layer is either a negative photoresist or a positive photoresist. In some embodiments, portions of the OPL irradiated by the electromagnetic radiation that patterns the photoresist layer are affected to change the etch selectivity of the irradiated portions of the OPL with respect to non-irradiated portions. In some embodiments, the photoresist layer is patterned and one or more etch processes are performed to transfer the pattern to the hard mask layer and to remove the portions of the mask stack other than the hard mask layer, resulting in the first patterned mask 130 defined by remaining portions of the hard mask layer.

In some embodiments, the first patterned mask 130 comprises elements 130A, 130B that define a pattern for forming fins in the semiconductor layer 105. In some embodiments, a density of the elements 130A in the region 102A is greater than a density of the elements 130B in the region 102B due to a different number of elements 130A per unit of area in the first region 102A compared to the number of elements 130B per unit of area in the second region 102B. In some embodiments, the density of the elements 130B in the region 102B is between about 13% and about 82% of the density of the elements 130A in the region 102A.

In some embodiments, a distance 128 between the elements 130A in the first region 102A is different than a distance 129 between the elements 130B in the second region 102B. In some embodiment, the distance 128 of the elements 130A in the first region 102A is between about 8% and about 77% of the distance 129 of the elements 130B in the second region 102B. In some embodiments, the distance 128 between the elements 130A in the first region 102A is between about 16 nm and about 20 nm. In some embodiments, the distance 129 between the elements 130B in the second region 102B is between about 26 nm and about 200 nm. In some embodiments, the distance 128 between the elements 130A in the first region 102A is the same as the distance 129 between the elements 130B in the second region 102B.

In some embodiments, a pitch 133 of the elements 130A in the first region 102A is different than a pitch 134 of the elements 130B in the second region 102B. In some embodiment, the pitch 133 of the elements 130A in the first region 102A is between about 12% and about 84% of the pitch 134 of the elements 130B in the second region 102B. In some embodiments, the pitch 133 of the elements 130A in the first region 102A is between about 26 nm and about 30 nm. In some embodiments, the pitch 134 of the elements 130B in the second region 102B is between about 36 nm and about 210 nm. In some embodiments, the pitch 133 of the elements 130A in the first region 102A is the same as the pitch 134 between the elements 130B in the second region 102B.

Referring to FIGS. 2-5, a cyclic etch process is performed to transfer the pattern defined by the first patterned mask 130 to the fourth layer 125. In some embodiments, the cyclic etch process comprises a polymer deposition phase, illustrated in FIGS. 2 and 4, and a material removal phase, illustrated in FIGS. 3 and 5. In some embodiments, processes gases are varied in the cyclic etch process between the polymer deposition phase and the material removal phase. In some embodiments, other parameters may also be varied between the polymer deposition phase and the material removal phase. For example, a plasma power or bias voltage may be varied between the polymer deposition phase and the material removal phase to control a degree of deposition or etching.

Figure 2:
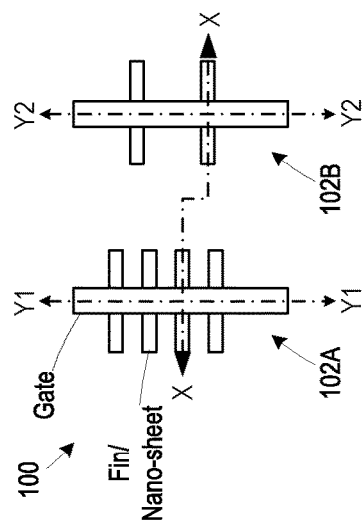
Figure 2:
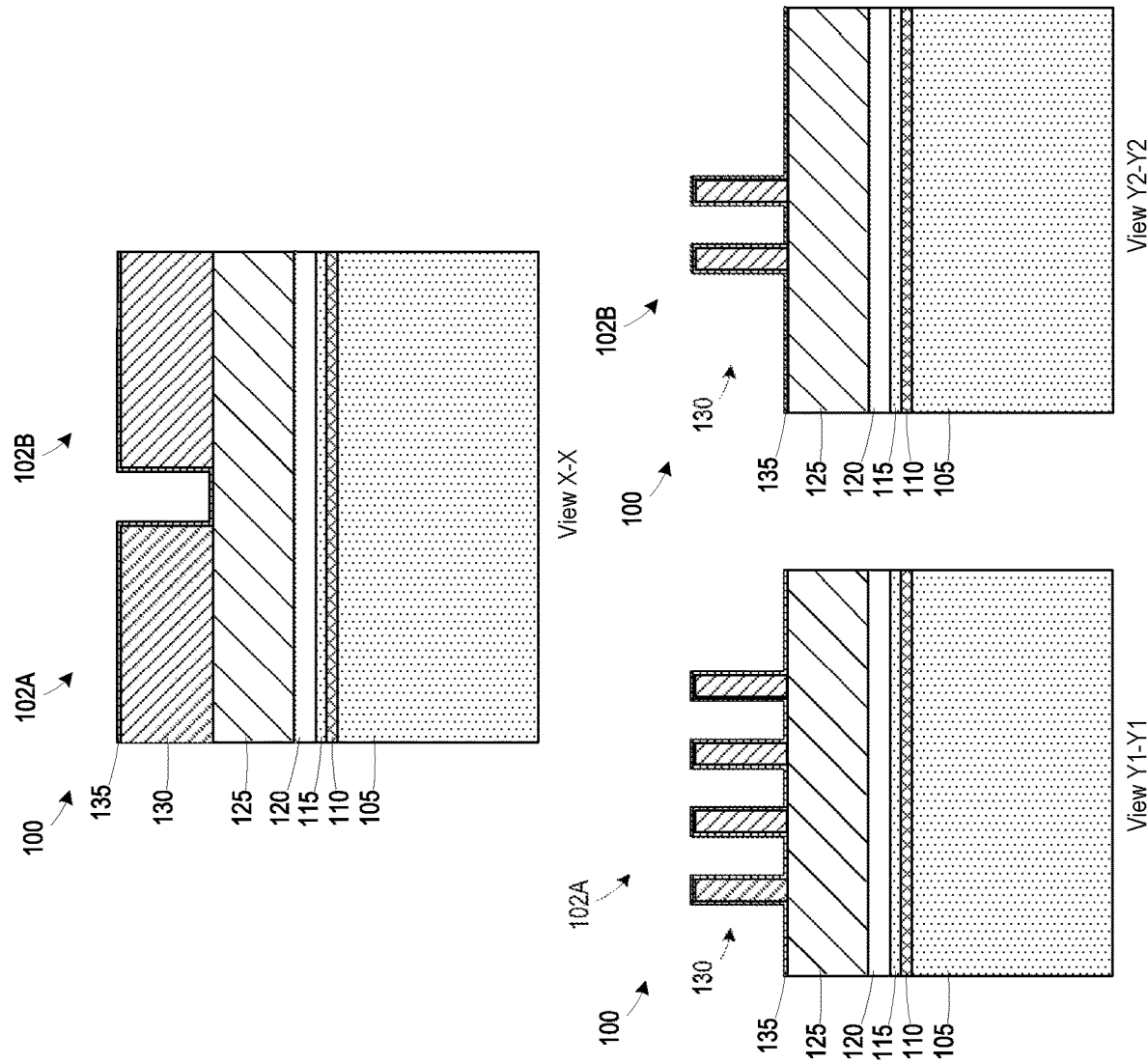

Referring to FIG. 2, a polymer layer 135 is formed over the first patterned mask 130 and the fourth layer 125 during the polymer deposition phase. In some embodiments, during the polymer deposition phase, at least one of oxygen ($O_2$), sulfur dioxide ($SO_2$), a fluorocarbon, or methane ($CH_4$) are used as the process gases to form a process gas mixture. In some embodiments, the fluorocarbon is at least one of $C_4F_6$, $C_2F_4$, $CF_4$, or $C_5F$. In some embodiments, oxygen and a fluorocarbon are used as the process gas mixture. In some embodiments, the flow rate of the fluorocarbon or methane is between about 40-60 sccm during the polymer deposition phase. In some embodiments, the flow rate of oxygen or sulfur dioxide is between about 50-80 sccm during the polymer deposition phase. In some embodiments, the oxygen and the fluorocarbon or methane in the process gas mixture react in ambient plasma to form the polymer layer 135. In some embodiments, the polymer layer comprises $CH_2$ or $CF_x$, where x is an integer greater than or equal to 1. In some embodiments, the polymer deposition phase comprises an atomic layer deposition (ALD) process. In some embodiments, the thickness of the polymer layer 135 is based on, among other things, a time interval of the polymer deposition phase, the plasma power, and the bias voltage. In some embodiments, the time interval of the polymer deposition phase, the plasma power during the polymer deposition phase, and the bias voltage during the polymer deposition phase are set such that the thickness of the polymer layer 135 is between 1-10 Angstroms, or between 2-4 Angstroms. In some embodiments, the time interval of the polymer deposition phase is between about 5 seconds and about 10 seconds. In some embodiments, the plasma power during the polymer deposition phase is about 0 W. In some embodiments, the bias voltage during the polymer deposition phase is about 70V to about 90V.

Figure 3:
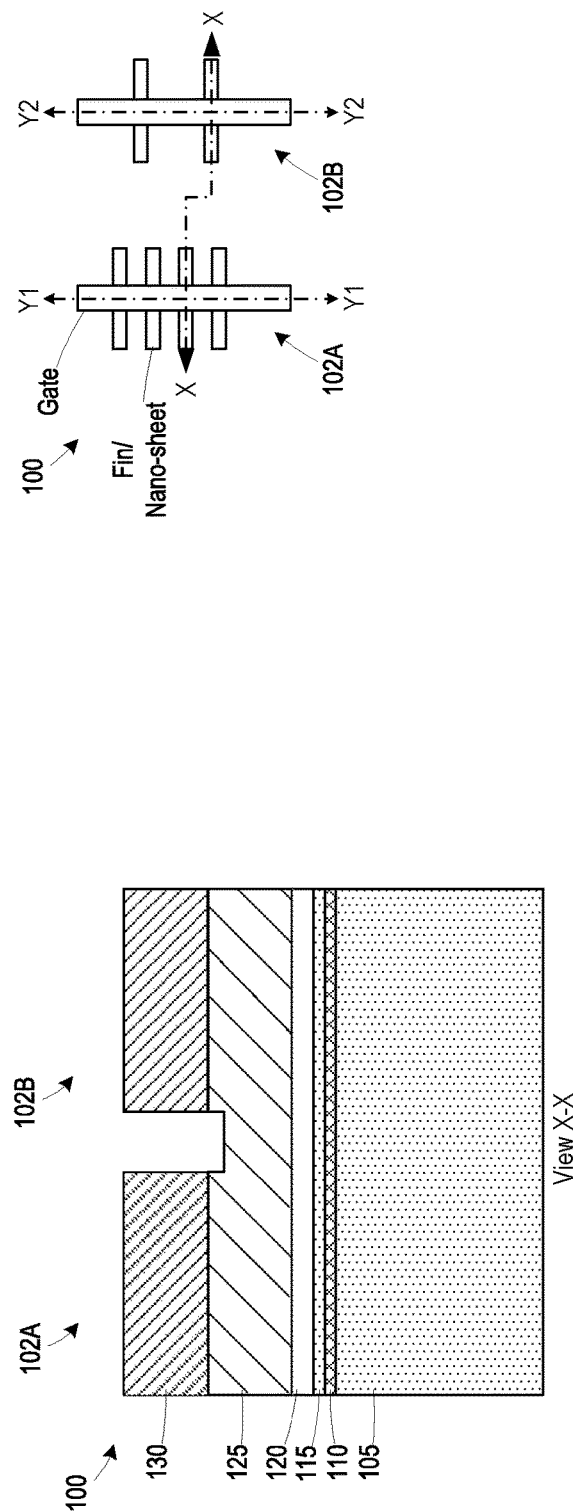
Figure 3:
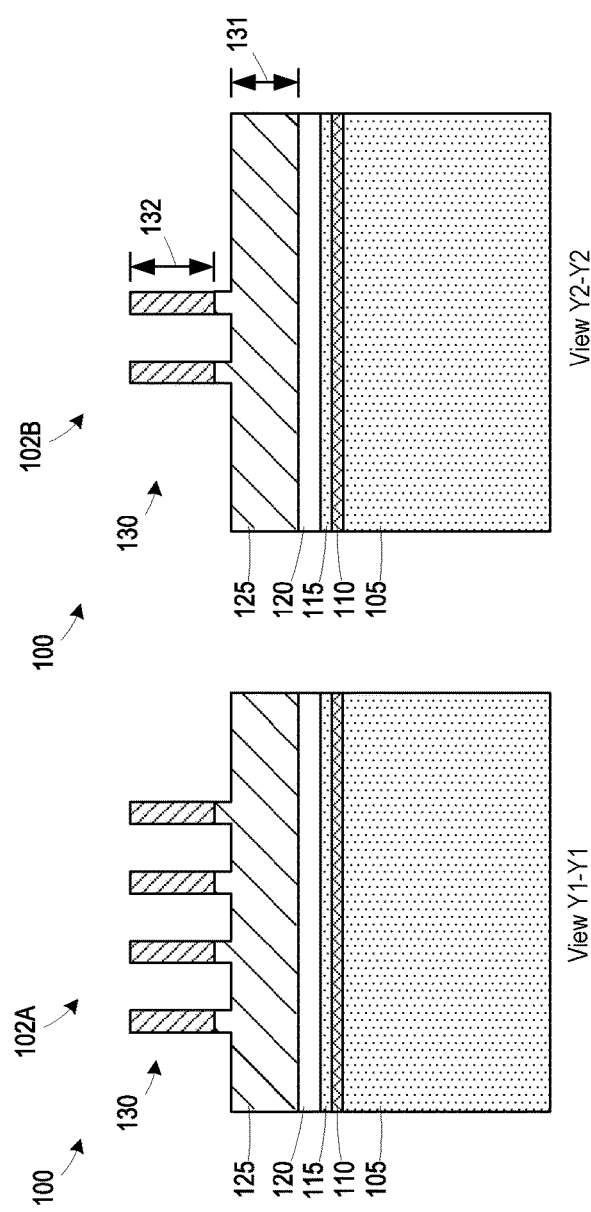

Referring to FIG. 3, the polymer layer 135 and a portion of the fourth layer 125 are removed during the material removal phase, in accordance with some embodiments. In some embodiments, during the material removal phase, an inert gas is employed as the process gas. In some embodiments, the inert gas is argon (Ar), nitrogen ($N_2$), or other suitable gas. In some embodiments, the flow rate of the inert gas is between about 550-600 sccm. In some embodiments, an amount of the fourth layer 125 that is removed during the material removal phase is based on, among other things, a time interval of the material removal phase, the plasma power, and the bias voltage. In some embodiments, the time interval of the material removal phase, the plasma power during the material removal phase, and the bias voltage during the material removal phase are set such that a thickness 131 of the portion or portions of the fourth layer 125 not underlying the first patterned mask 130 is reduced by about 10-20 Angstroms during the material removal phase. In some embodiments, the time interval of the material removal phase is between about 5 seconds and about 10 seconds. In some embodiments, the plasma power during the material removal phase is greater than the plasma power during the polymer deposition phase. In some embodiments, the plasma power during the material removal phase is about 70 W to about 90 W. In some embodiments, the bias voltage during the material removal phase is greater than the bias voltage during the polymer deposition phase.

In some embodiments, the bias voltage during the material removal phase is about 100V to about 120V.

In some embodiments, during the material removal phase, a portion of the first patterned mask 130 is also removed. For example, a thickness 132 of the first patterned mask or elements thereof may be reduced by about 1-20 Angstroms during the material removal phase.

In some embodiments, other parameters of the process, in addition to the process gas(es), are varied between the polymer deposition phase and the material removal phase. For example, in some embodiments, plasma parameters are also varied between the polymer deposition phase and the material removal phase. In some embodiments, the plasma power is high and the bias voltage is low during the polymer deposition phase. In some embodiments, the plasma power is low and the bias voltage is high during the material removal phase. In some embodiments, a high plasma power is between about 1000-3000 W, and a low plasma power is between about 300-500 W. In some embodiments, a high bias voltage is between about 500-1500 V, and a low bias voltage is between about 0-100 V.

In some embodiments, a purge phase is included in the cyclic etch process between the polymer deposition phase and the material removal phase to allow the process gas(es) to be changed between the polymer deposition phase and the material removal phase. In some embodiments, during a purge phase, an inert gas, such as argon, nitrogen or other suitable gas, is applied into a chamber in which the semiconductor device 100 is disposed during the polymer deposition phase and material removal phase to purge the chamber of the process gas(es). In some embodiments, during the purge phase, no plasma power is provided and there is no bias voltage applied.

Figure 4:
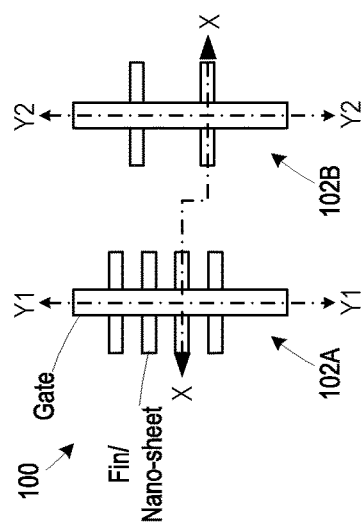
Figure 4:
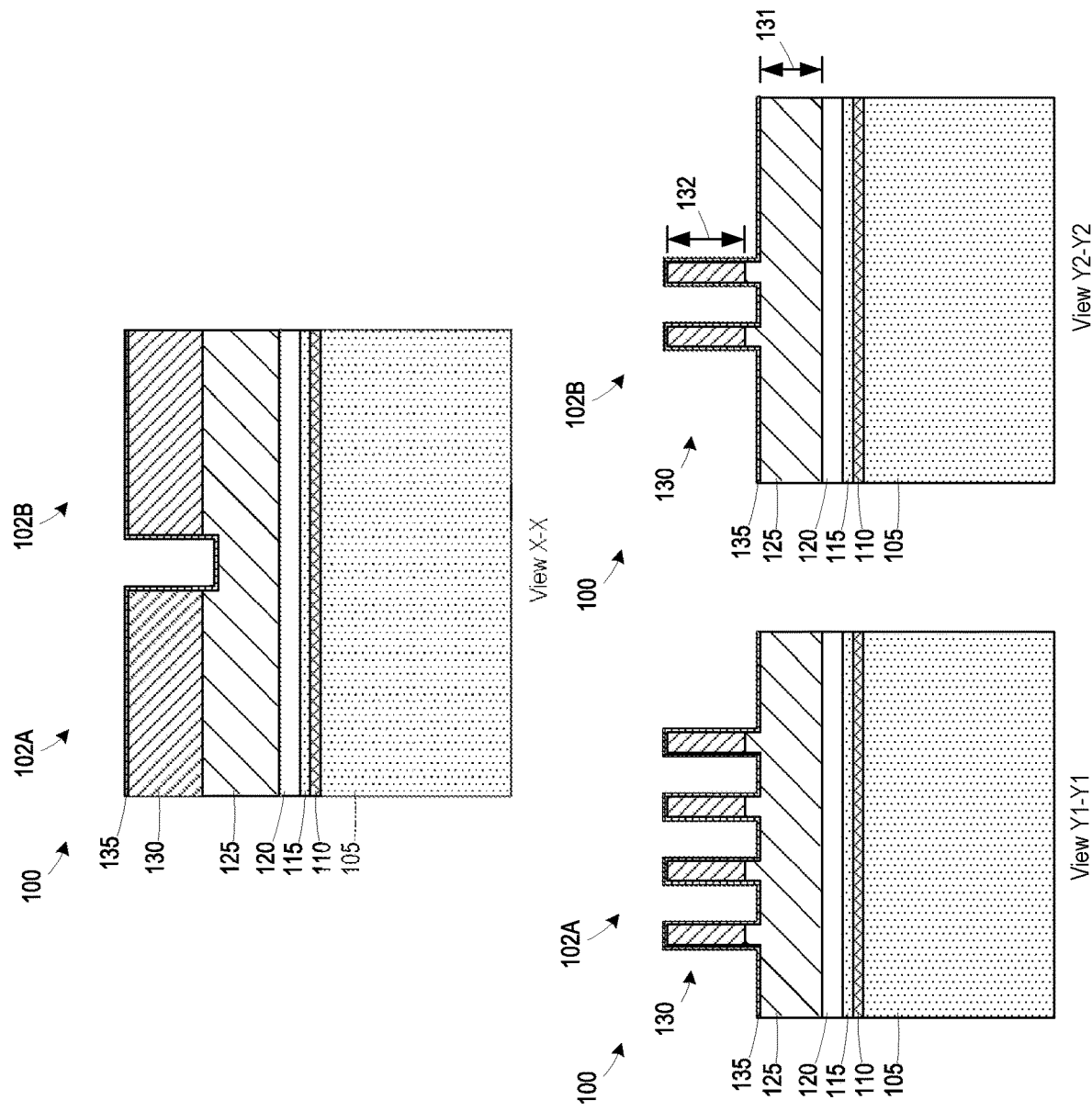
Figure 5:
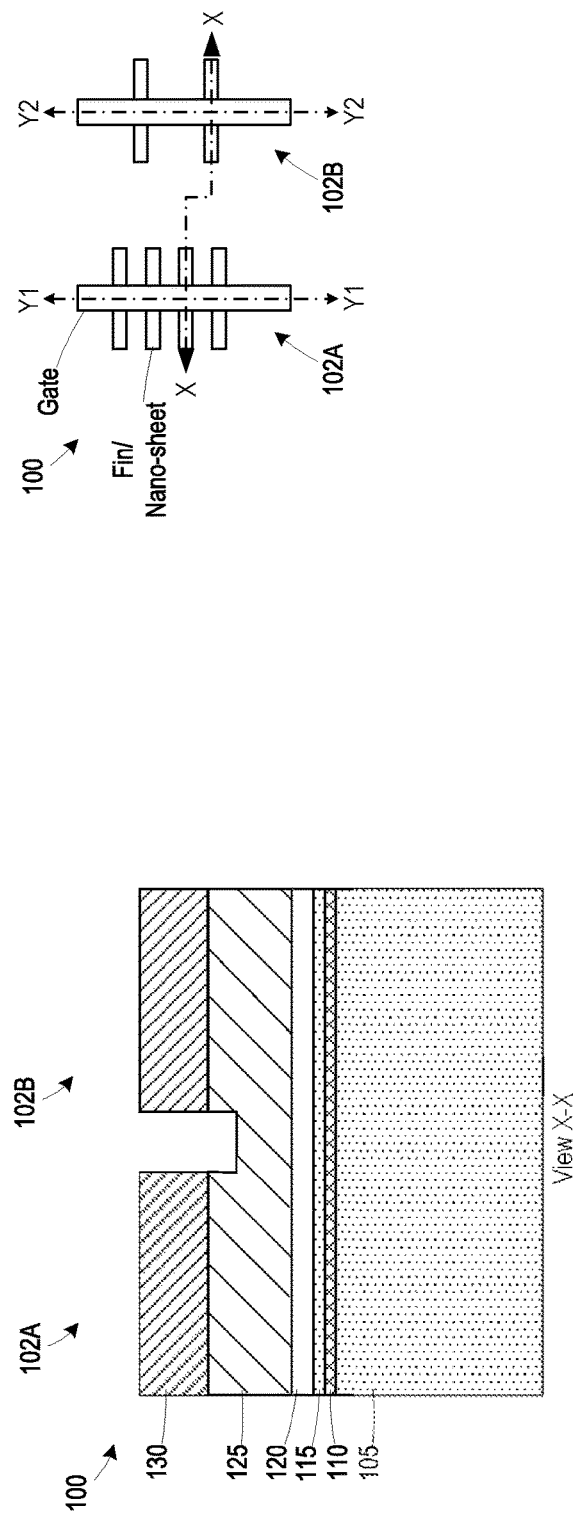
Figure 5:
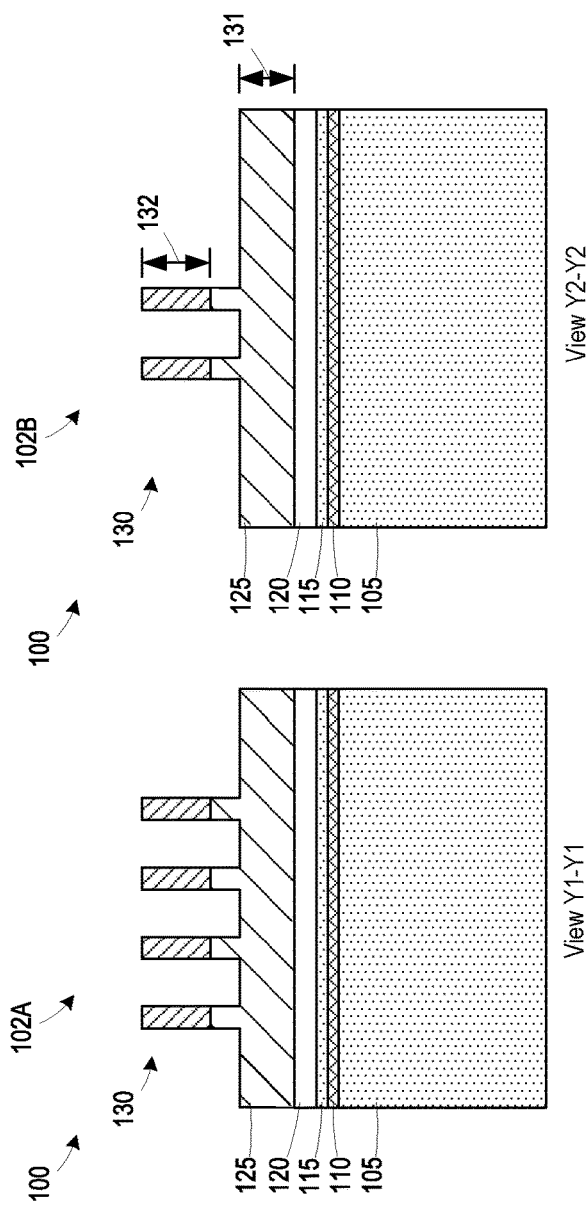

Referring to FIGS. 4 and 5, the aforementioned cyclic etch process is repeated. For example, in some embodiments, the polymer layer 135 is formed again over the remaining first patterned mask 130 and the remaining fourth layer 125 during the polymer deposition phase, as illustrated in FIG. 4. In some embodiments, the polymer layer 135 and another portion of the fourth layer 125 are removed during the material removal phase to further reduce the thickness 131 of the portion or portions of the fourth layer 125 not underlying the first patterned mask 130, as illustrated in FIG. 5. In some embodiments, another portion of the first patterned mask 130 is also removed during the material removal phase to further reduce the thickness 132 of the first patterned mask 130.

In some embodiments, process parameters are held constant during each polymer deposition phase and are held constant during each polymer deposition phase. For example, the flow rate(s) of a process gas(es) applied during each polymer deposition phase, the time interval of each polymer deposition phase, the plasma power during each polymer deposition phase, and the bias voltage during each polymer deposition phase may be the same. Similarly, the flow rate(s) of a process gas(es) applied during each material removal phase, the time interval of each material removal phase, the plasma power during each material removal phase, and the bias voltage during each material removal phase may be the same. In some embodiments, one or more process parameters may be varied between polymer deposition phases or may be varied between material removal phases. For example, in some embodiments, while the fourth layer 125 is relatively thick, the flow rate(s) of a process gas(es) applied during material removal phases, the time interval of material removal phases, the plasma power during material removal phases, and the bias voltage during material removal phases may be selected so as to remove a first amount or thickness of the fourth layer during each cycle of the material removal phase. In some embodiments, when the fourth layer 125 is thinner (i.e., after several or many cycles), the flow rate(s) of a process gas(es) applied during material removal phases, the time interval of material removal phases, the plasma power during material removal phases, and the bias voltage during material removal phases may be selected so as to remove a second amount or thickness of the fourth layer 125 during each cycle of the material removal phase. In some embodiments, the second amount or thickness is less than the first amount or thickness.

Figure 6:
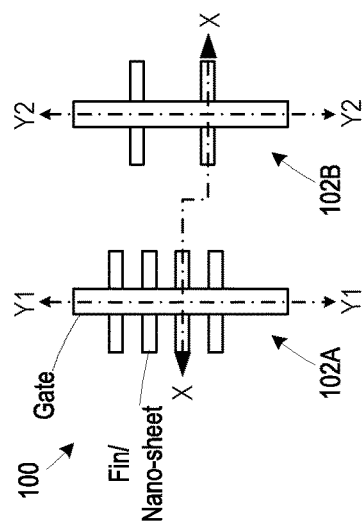
Figure 6:
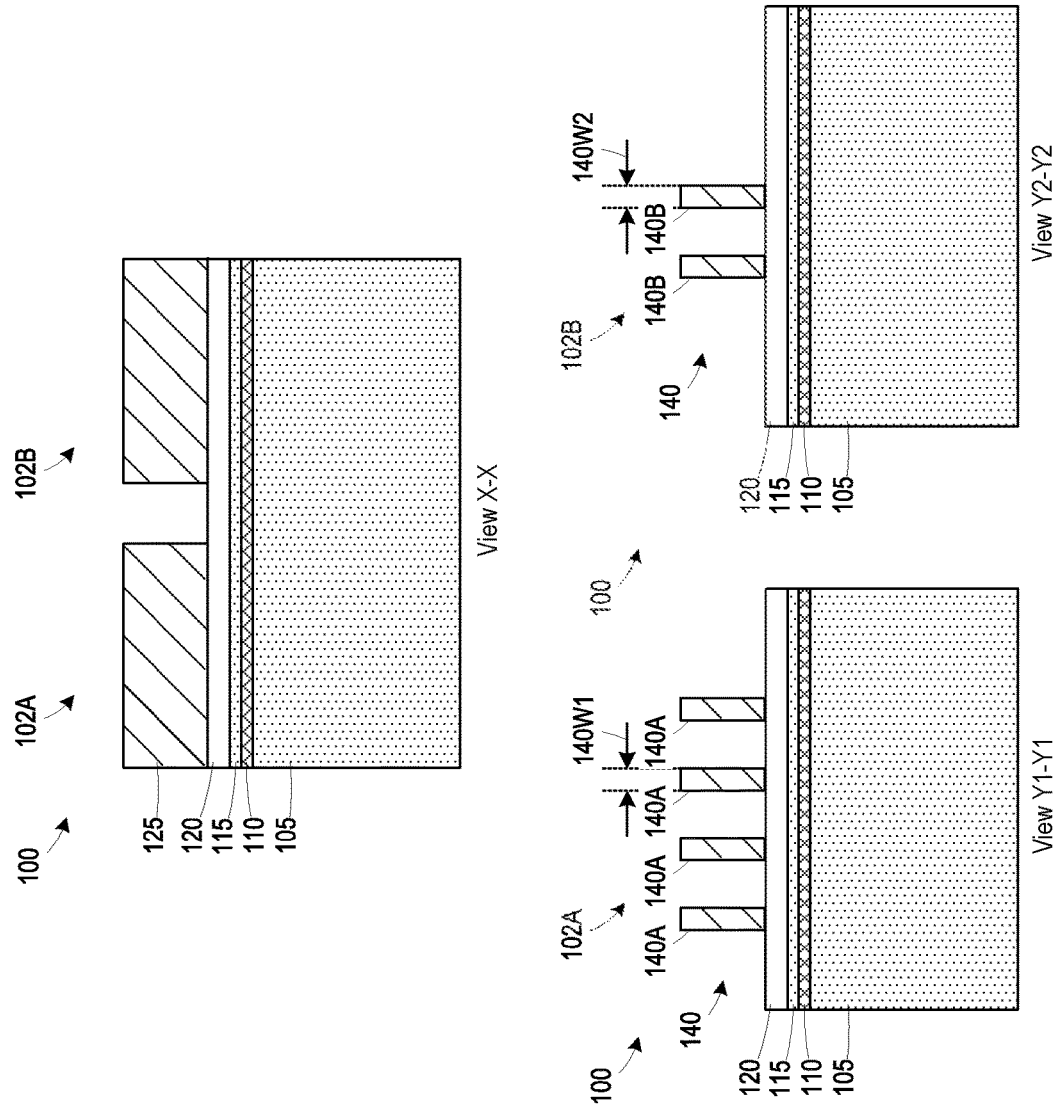

Referring to FIG. 6, the polymer deposition phase of FIGS. 2 and 4 and the material removal phase of FIGS. 3 and 5 are repeated in a cyclic fashion until the fourth layer 125 is patterned to define a second patterned mask 140 comprising elements 140A, 140B, in accordance with some embodiments. In some embodiments, the cyclic etch process terminates responsive to exposing the third layer 120. In some embodiments, a thickness of the first patterned mask 130 is provided such that the first patterned mask 130 is consumed about the same time in the etch processing that the third layer 120 is exposed by removal of the fourth layer 125. Thus, in some embodiments, a top surface of portions of the fourth layer 125 underlying the elements 130A, 130B of the first patterned mask 130 is exposed at the conclusion of the cyclic etch process. According to some embodiments, the number of cycles varies depending on the thickness of the fourth layer 125. In some embodiments, the number of cycles in the cyclic etch process is about 120-140 cycles.

In some embodiments, the cyclic etch process described with reference to FIGS. 2-5 preserves a width 140W1 of the elements 140A and a width 140W2 of the elements 140B. In some embodiments, the ALD process for forming the polymer layer 135 provides a relatively thin polymer layer 135 that is substantially of uniform thickness in the first region 102A and the region 102B. In contrast, if a thicker polymer layer were to be used, the polymer layer 135 may exhibit reduced thickness over elements 130A in the center of the first region 102A as compared to the elements 130A in the outer area of the first region 102A or the elements 130B in the second region 102B. In some embodiments, the elements with a reduced thickness polymer layer would be consumed at a greater rate resulting in width variation in the different regions 102A, 102B with respect to CD and increased tapering. In some embodiments, the cyclic etch process, using a thin polymer layer 135 of substantially uniform thickness and a partial etching of the fourth layer 125 during the material removal phase, reduces etch loading across the regions 102A, 102B arising from the different densities of the regions 102A, 102B. In some embodiments, the etch loading across the regions 102A, 102B is less than or equal to about 2 nm. In some embodiments, the etch loading across the regions 102A, 102B is less than or equal to about 1 nm. The cyclic etch process results in reduced fin tapering and improved line width roughness, in accordance with some embodiments.

Figure 7:
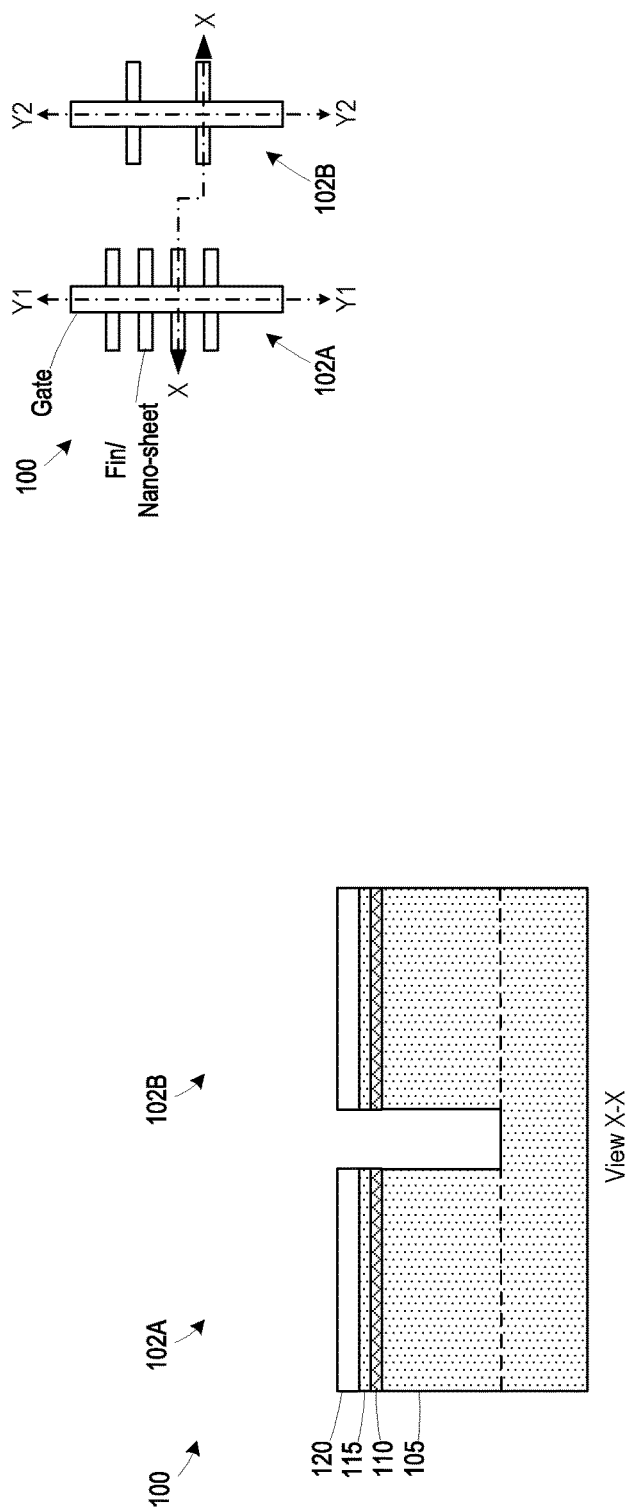
Figure 7:
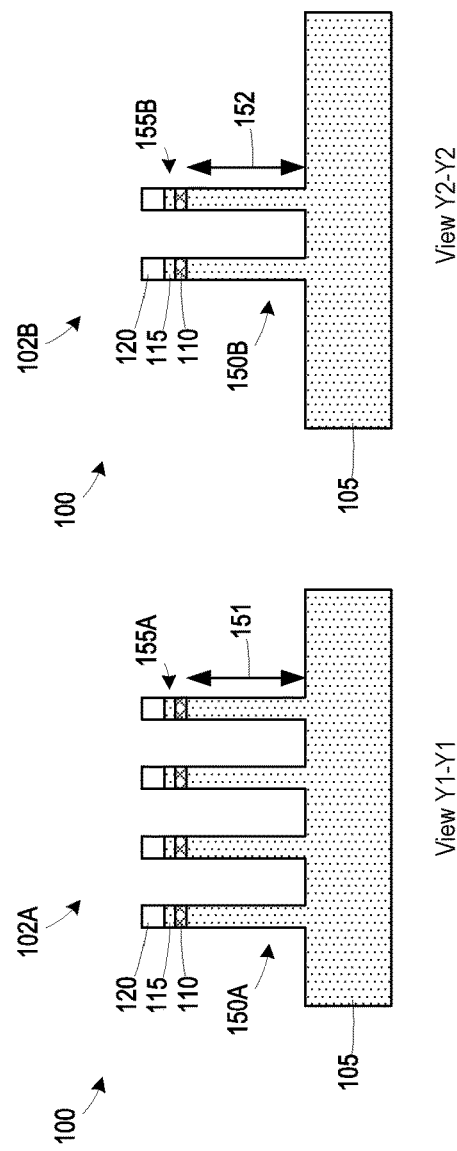

Referring to FIG. 7, portions of the third layer 120, the second layer 115, the first layer 110, and the semiconductor layer 105 are removed to form fins 150A, 150B in the semiconductor layer 105, in accordance with some embodiments. In some embodiments, an etch process is performed using the second patterned mask 140 as an etch template to form the fins 150A, 150B. In some embodiments, the second patterned mask 140 is removed after the portions of the third layer 120, the second layer 115, the first layer 110, and the semiconductor layer 105 150B are etched. In some embodiments, due to the aforementioned process of forming the second patterned mask 140, a difference between an average height 151 of fins 150A in the first region 102A, having a first density of fins, and an average height 152 of fins 150B in the second region 102B, having a first density of fins, is less than or equal to 2 nanometers or less than or equal to 1 nanometer.

In some embodiments, remaining portions of the third layer 120, the second layer 115, and the first layer 110 define cap layers 155A, 155B on the upper surfaces of the fins 150A, 150B. In general, the fins 150A, 150B define active regions for forming devices, such as FinFET transistors.

Figure 8:
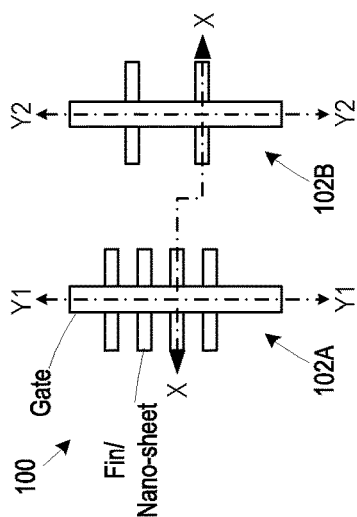
Figure 8:
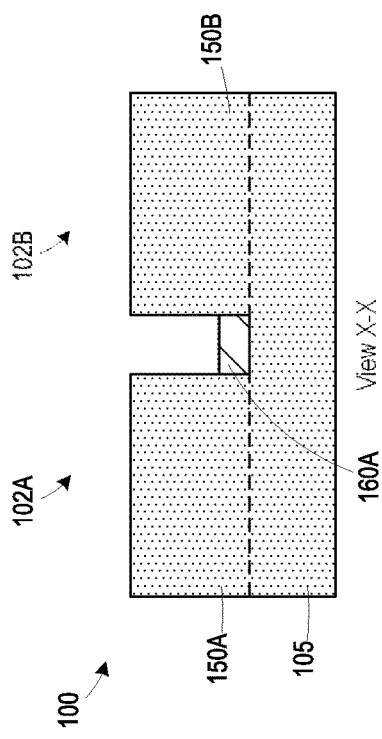
Figure 8:
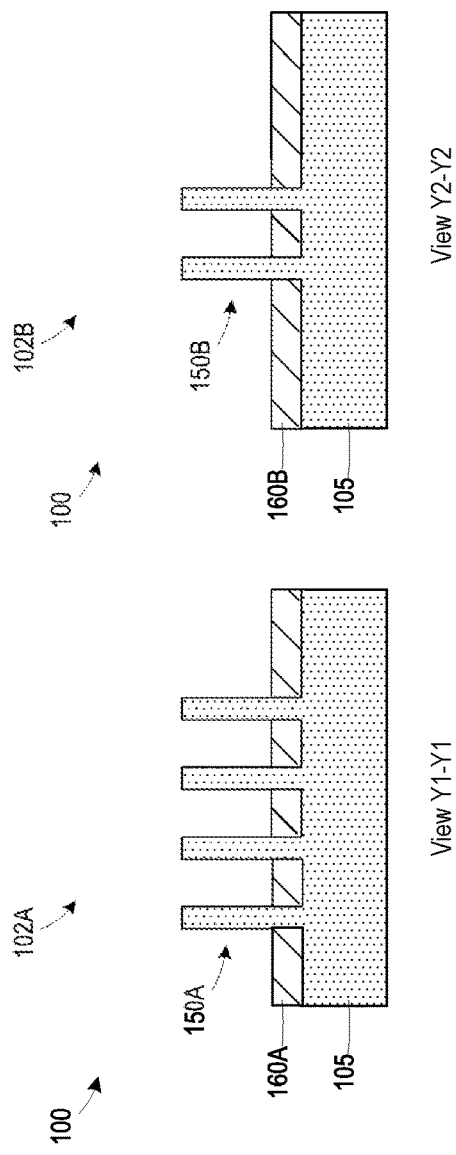

Referring to FIG. 8, isolation structures 160A, 160B are formed between the fins 150A, 150B, respectively, and the cap layers 155A, 155B are removed, in accordance with some embodiments. In some embodiments, the isolation structures 160A, 160B comprise shallow trench isolation (STI) structures. In some embodiments, the isolation structures 160A, 160B are formed by depositing a dielectric layer between the fins 150A, 150B and recessing the dielectric layer to expose at least portions of the sidewalls of the fins 150A, 150B that were concealed when the dielectric layer was deposited. In some embodiments, the isolation structures 160A, 160B comprise silicon and oxygen or other suitable materials. In some embodiments, a portion of the isolation structure 160A separates the regions 102A, 102B. In some embodiments, one or more etch processes are performed to recess the dielectric layer and remove the cap layers 155A, 155B.

Figure 9:
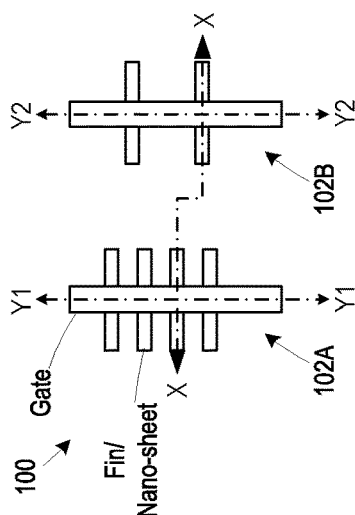
Figure 9:
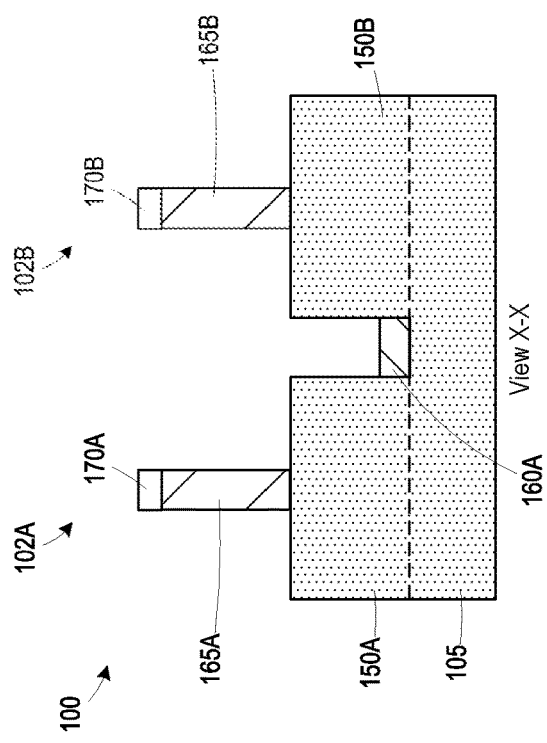
Figure 9:
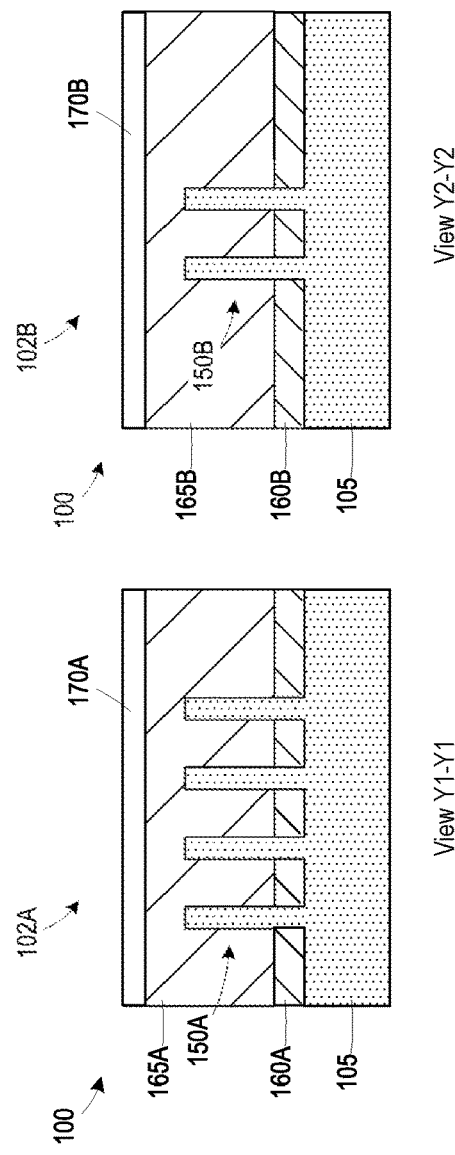

Referring to FIG. 9, sacrificial gate structures 165A, 165B are formed over the fins 150A, 150B and over the isolation structures 160A, 160B, respectively, in accordance with some embodiments. In some embodiments, the sacrificial gate structures 165A, 165B comprise a gate dielectric layer and a sacrificial gate electrode (not separately shown). In some embodiments, the gate dielectric layer comprises a high-k dielectric material. As used herein, the term "high-k dielectric material" refers to a material having a dielectric constant, k, greater than or equal to about 3.9, which is the k value of $SiO_2$. The material of the high-k dielectric layer may be any suitable material. Examples of the material of the high-k dielectric layer include but are not limited to $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, SiON, $SiN_x$, a silicate thereof, or an alloy thereof. Each value of x is independently from 0.5 to 3, and each value of y is independently from 0 to 2. In some embodiments, the gate dielectric layer comprises a native oxide layer formed by exposure of the semiconductor device 100 to oxygen at various points in the process flow, causing the formation of silicon dioxide on exposed surfaces of the fins 150A, 150B. In some embodiments, an additional layer of dielectric material, such as silicon dioxide or other suitable materials, is formed over the native oxide to form the gate dielectric layer. In some embodiments, the sacrificial gate electrode comprises polysilicon.

According to some embodiments, the sacrificial gate structures 165A, 165B are formed by forming a layer of sacrificial material and a hard mask layer over the fins 150A, 150B and the isolation structures 160A, 160B. In some embodiments, a patterning process is performed to pattern the hard mask layer corresponding to the pattern of gate structures to be formed, and an etch process is performed using the patterned hard mask layer to etch the sacrificial layer to define the sacrificial gate structures 165A, 165B. In some embodiments, remaining portions of the hard mask layer form cap layers 170A, 170B over the sacrificial gate electrodes of the sacrificial gate structures 165A, 165B.

Figure 10:
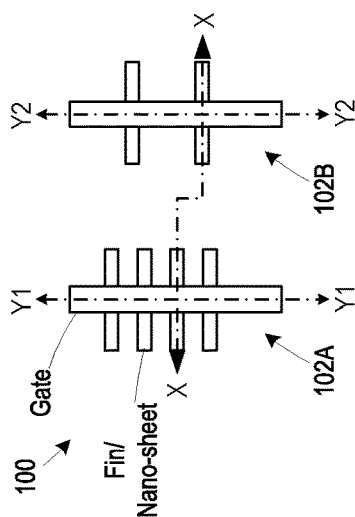
Figure 10:
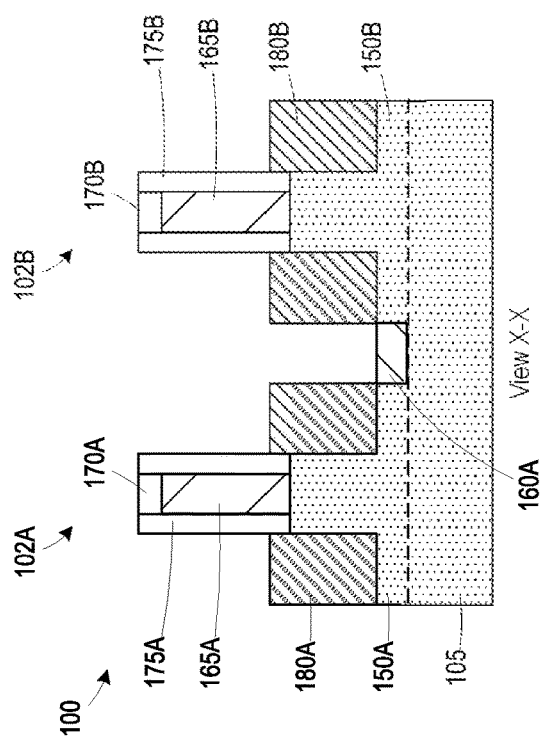
Figure 10:
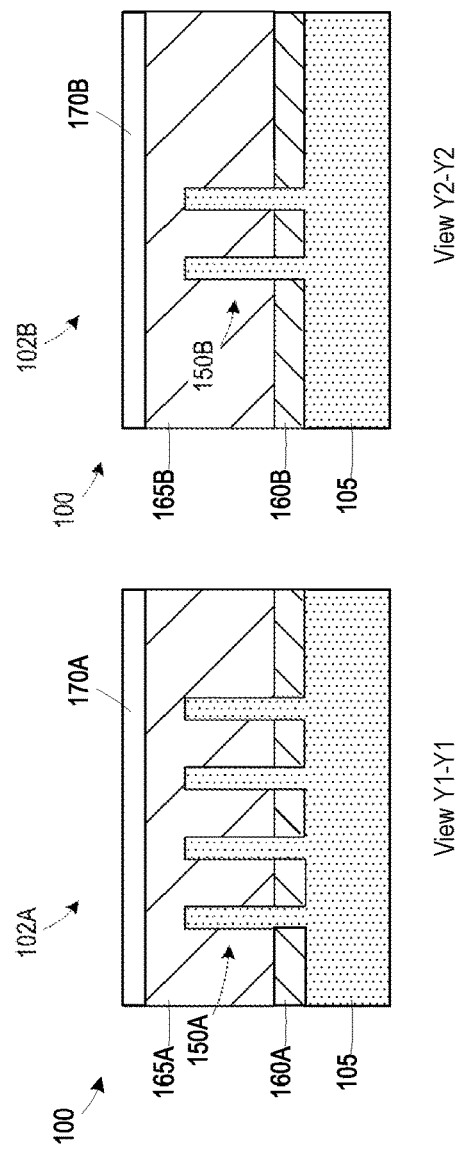

Referring to FIG. 10, sidewall spacers 175A, 175B are formed adjacent the sacrificial gate structures 165A, 165B, respectively, and source/drain regions 180A, 180B are formed in the fins 150A, 150B or over the fins 150A, 150B, respectively, after forming the sidewall spacers 175A, 175B. In some embodiments, the sidewall spacers 175A, 175B are formed by depositing a spacer layer over the sacrificial gate structures 165A, 165B and performing an etch process, such as an anisotropic etch process or other suitable etch process, to remove portions of the spacer layer positioned on horizontal surfaces of the cap layers 170A, 170B, the fins 150A, 150B, and the isolation structures 160A, 160B. In some embodiments, the sidewall spacers 175A, 175B comprise the same material composition as the cap layers 170A, 170B. In some embodiments, the sidewall spacers 175A, 175B comprise nitrogen and silicon or other suitable materials.

In some embodiments, the source/drain regions 180A, 180B are formed by performing an etch process to recess the fins 150A, 150B adjacent the sidewall spacers 175A, 175B and an epitaxial growth process is performed to form the source/drain regions 180A, 180B. In some embodiments, the source/drain regions 180A, 180B are doped in situ during the epitaxial growth process. In some embodiments, the source/drain regions 180A, 180B are formed by implantation of dopants into the fins 150A, 150B. In some embodiments, the source/drain regions 180A, 180B comprise a different silicon alloy than the fins 150A, 150B. For example, the fins 150A, 150B comprise silicon, and the source/drain regions 180A, 180B comprise silicon germanium, silicon tin, or another silicon alloy. In some embodiments, the source/drain regions 180A, 180B and the fins 150A, 150B are the same silicon alloy, but the concentration of the alloy material differs between the source/drain regions 180A, 180B and the fins 150A, 150B. For example, a concentration of the alloy material in the source/drain regions 180A, 180B may be greater than a concentration of the alloy material in the fins 150A, 150B.

Figure 11:
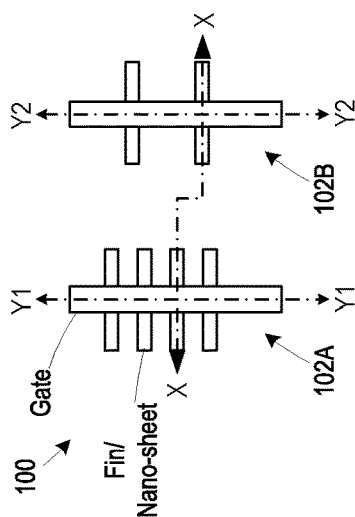
Figure 11:
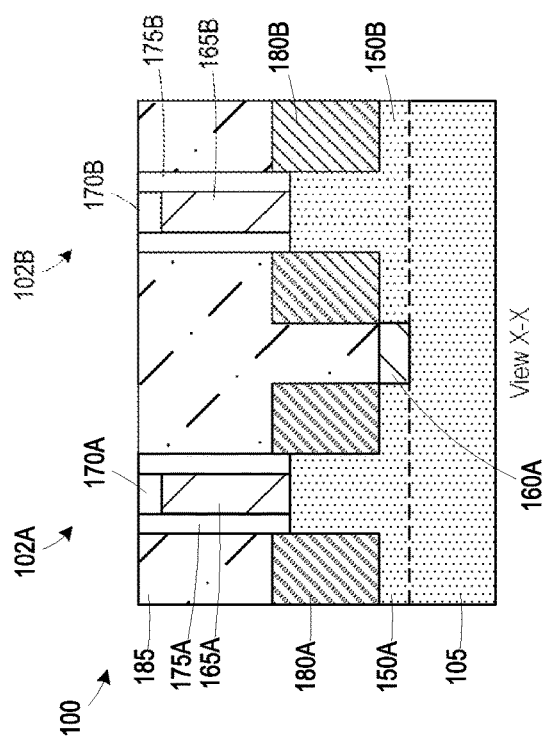
Figure 11:
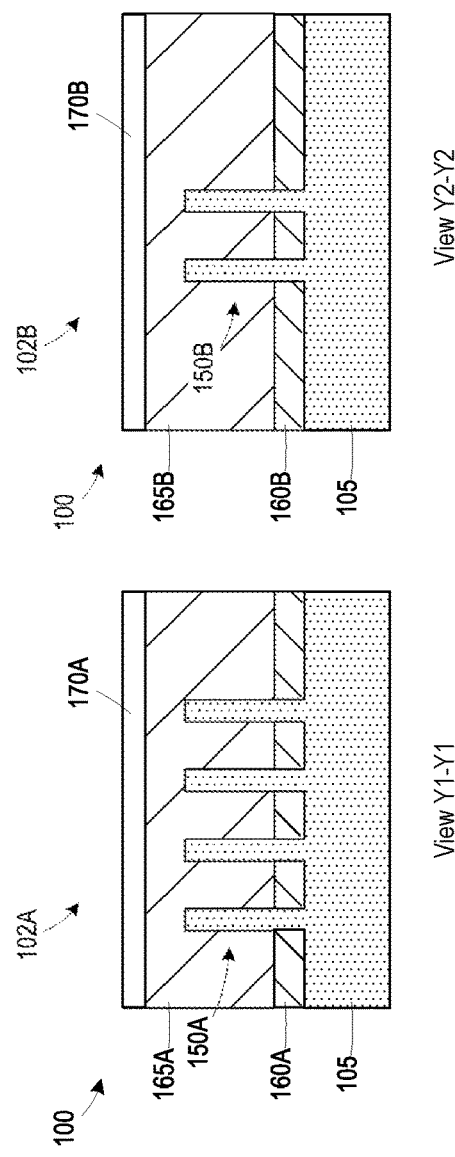

Referring to FIG. 11, a dielectric layer 185 is formed over the fins 150A, 150B and adjacent the sacrificial gate structures 165A, 165B, in accordance with some embodiments. In some embodiments, a portion of the dielectric layer 185 is removed to expose the cap layers 170A, 170B. In some embodiments, the dielectric layer 185 is planarized to expose the cap layers 170A, 170B. In some embodiments, the dielectric layer 185 comprises silicon dioxide or a low-k material. In some embodiments, the dielectric layer 185 comprises one or more layers of low-k dielectric material. Low-k dielectric materials have a k-value (dielectric constant) lower than about 3.9. Some low-k dielectric materials have a k-value lower than about 3.5 and may have a k-value lower than about 2.5. In some embodiments, the dielectric layer 185 comprises at least one of Si, O, C, or H, such as SiCOH and SiOC, or other suitable materials. In some embodiments, organic materials such as polymers are used for the dielectric layer 185. In some embodiments, the dielectric layer 185 comprises one or more layers of a carbon-containing material, organo-silicate glass, a porogen-containing material, or combinations thereof. In some embodiments, the dielectric layer 185 comprises nitrogen. In some embodiments, the dielectric layer 150 may be formed by using, for example, at least one of PECVD, LPCVD, ALCVD, or a spin-on technology.

Figure 12:
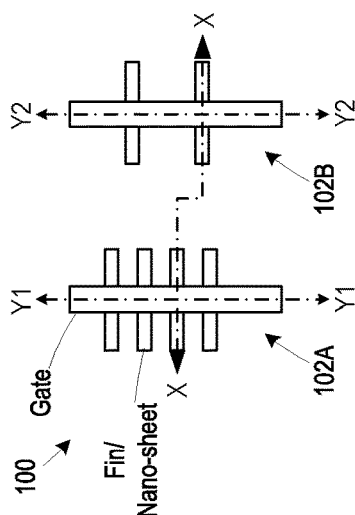
Figure 12:
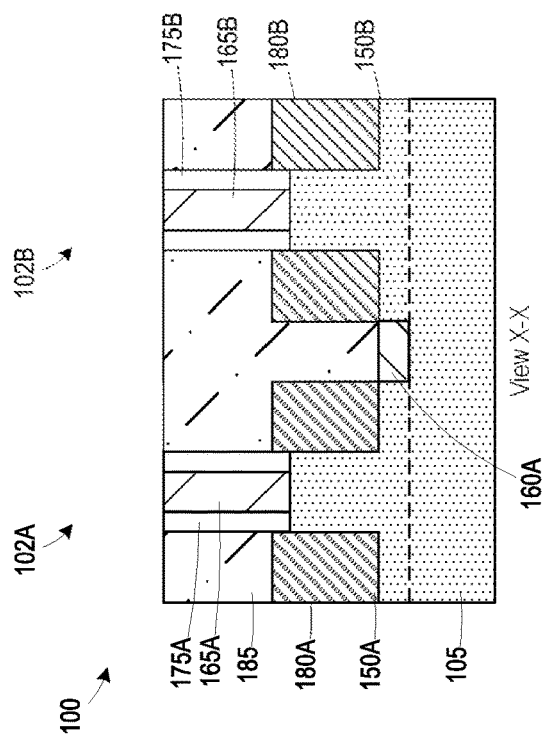
Figure 12:
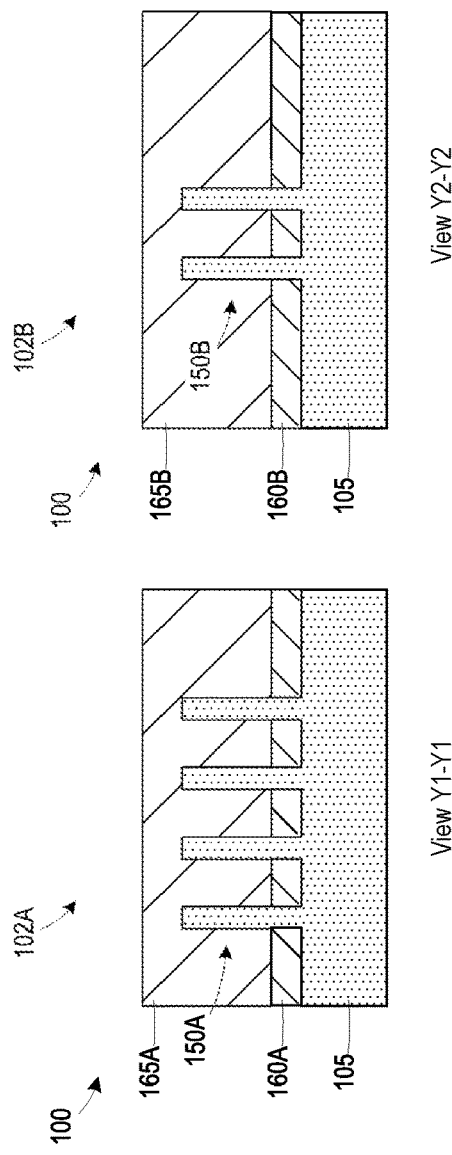

Referring to FIG. 12, the cap layers 170A, 170B are removed and heights of the sidewall spacers 175A, 175B and the dielectric layer 185 are reduced, in accordance with some embodiments. In some embodiments, a planarization process is performed to remove cap layers 170A, 170B and reduce the heights of the sidewall spacers 175A, 175B and the dielectric layer 185. In some embodiments, the planarization process exposes the sacrificial gate structures 165A, 165B. In some embodiments, the planarization process is a continuation of the process performed to planarize the dielectric layer 185.

Figure 13:
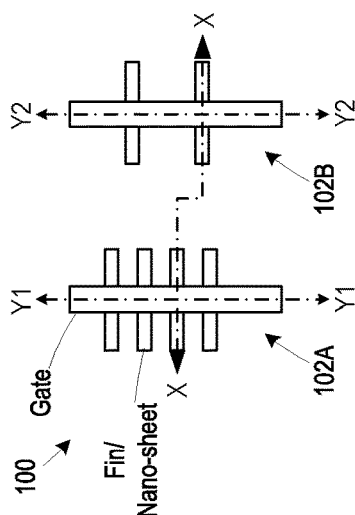
Figure 13:
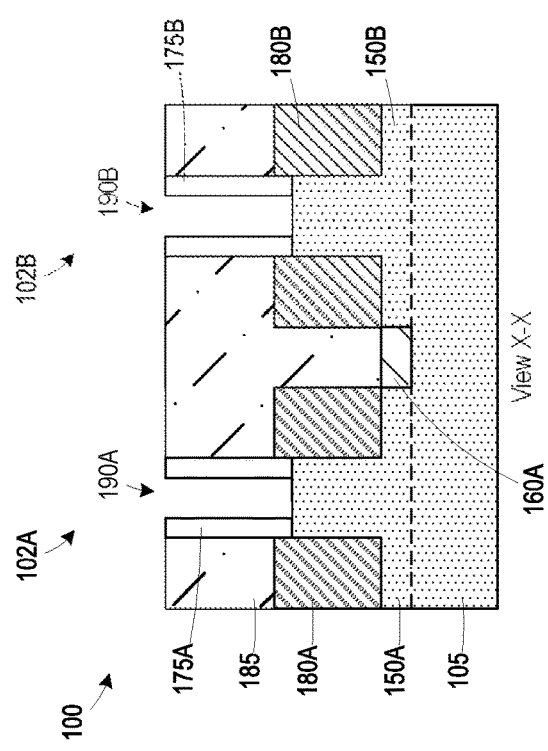
Figure 13:
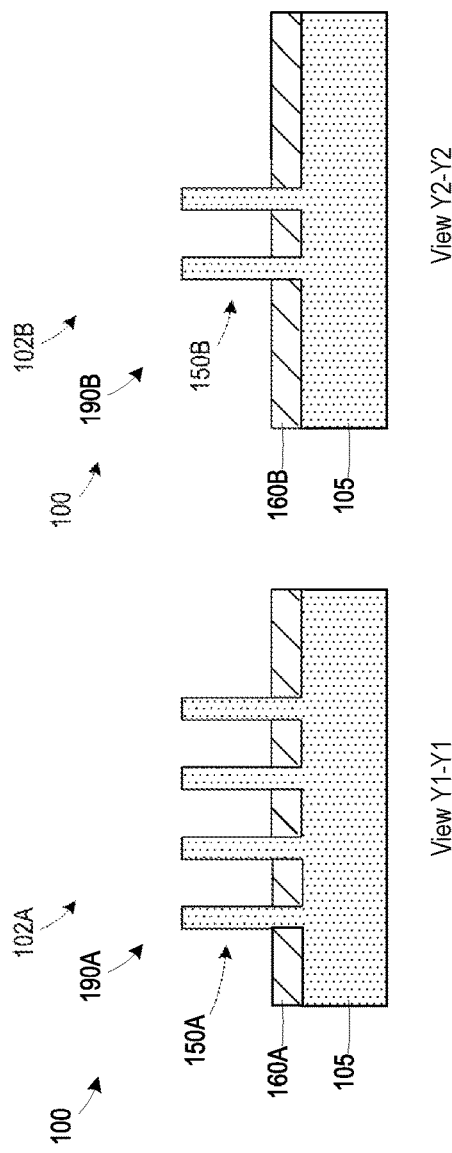

Referring to FIG. 13, the sacrificial gate structures 165A, 165B are removed to define gate cavities 190A, 190B, in accordance with some embodiments. In some embodiments, the gate electrode material and the gate dielectric layer of the sacrificial gate structures 165A, 165B are removed and portions of the fins 150A, 150B are exposed. In some embodiments, one or more etch processes are performed to remove the sacrificial gate structures 165A, 165B. In some embodiments, the etch process is a wet etch process selective to the material of the sacrificial gate structures 165A, 165B.

Figure 14:
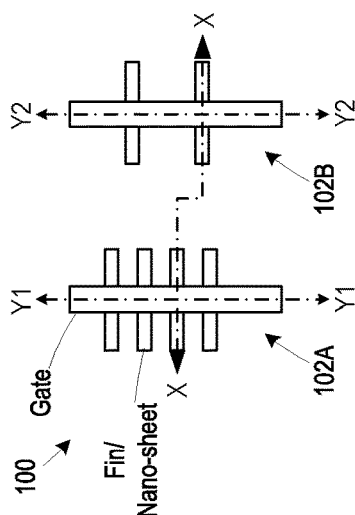
Figure 14:
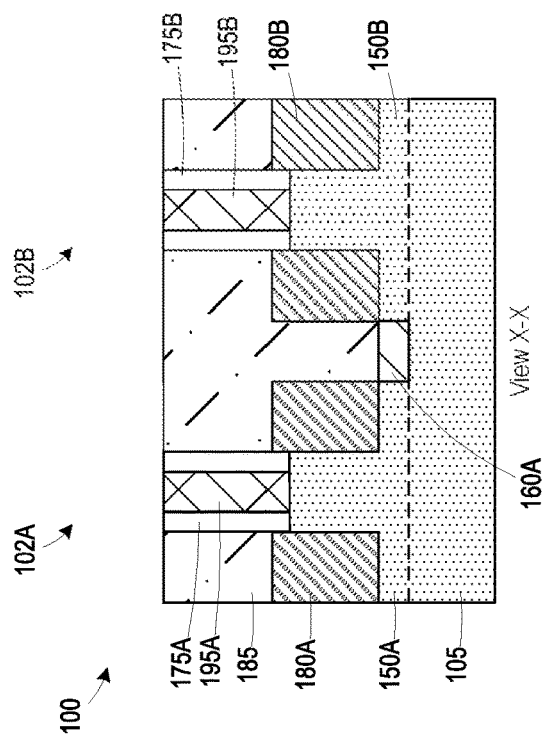
Figure 14:
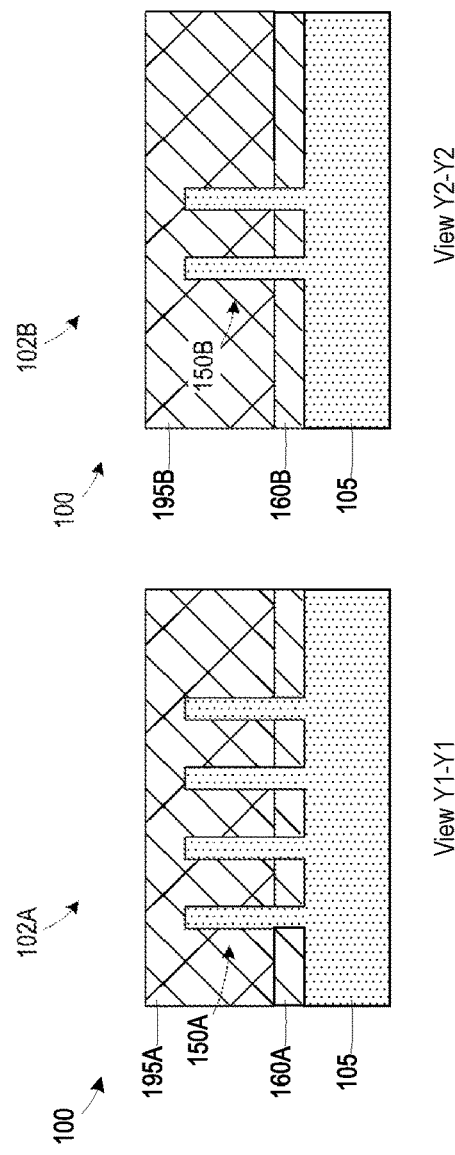

Referring to FIG. 14, replacement gate structures 195A, 195B are formed in the gate cavities 190A, 190B, respectively, in accordance with some embodiments. In some embodiments, the replacement gate structures 195A, 195B comprise a gate dielectric layer. In some embodiments, the gate dielectric layer comprises a high-k dielectric material. In some embodiments, a native oxide is present on the exposed surfaces of the fins 150A, 150B due to exposure to oxygen at various points in the process flow, and the gate dielectric layer is formed over the native oxide. In some embodiments, the native oxide is removed prior to forming the gate dielectric layer. In some embodiments, a work function material layer is formed over the gate dielectric layer. In some embodiments, the work function material layer comprises a p-type work function material layer, such as at least one of TiN, TaN, Ru, Mo, Al, WN, $ZrSi_2$, $MoSi_2$, $TaSi_2$, $NiSi_2$, WN, or other suitable p-type work function materials. In some embodiments, the work function material layer comprises an n-type work function metal, such as at least one of Ti, Ag, TaAl, TaAlC, TiAlN, TaC, TaCN, TaSiN, Mn, Zr, or other suitable n-type work function materials. In some embodiments, the work function material layer comprises a plurality of layers. In some embodiments, the material of the work function material layer varies between regions 102A, 102B. For example, the work function material layer in one region 102A, 102B comprises a p-type work function metal, and the work function material layer in another region 102A, 102B comprises an n-type work function material. In some embodiments, a first material of the work function material layer is formed in both regions 102A, 102B. A mask layer is formed and patterned to expose a selected region 102B, and an etch process is performed to remove the first material of the work function material layer from the selected region 102B. The mask layer is removed and a second material of the work function material layer is formed over the first material of the work function material layer. In some embodiments, the second material of the work function material layer is removed from the region 102A by masking the region 102B and performing an etch process to remove the second material of the work function material layer from the region 102A. In some embodiments, the second material of the work function material layer remains in place over the first material of the work function material layer.

In some embodiments, a conductive fill layer is formed over the work function material layer. In some embodiments, the conductive fill layer comprises tungsten (W) or other suitable conductive materials.

Figure 15:
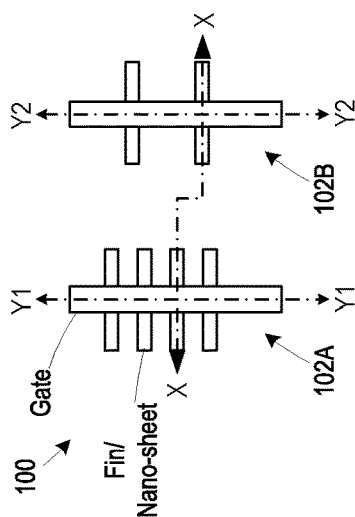
Figure 15:
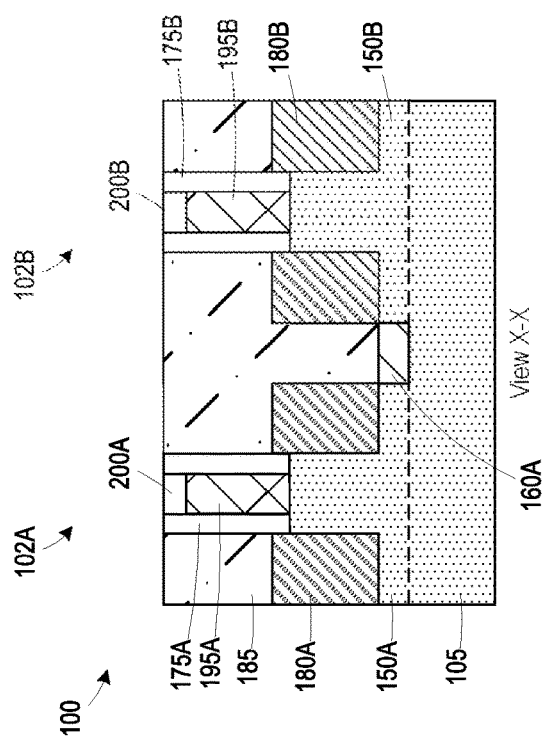
Figure 15:
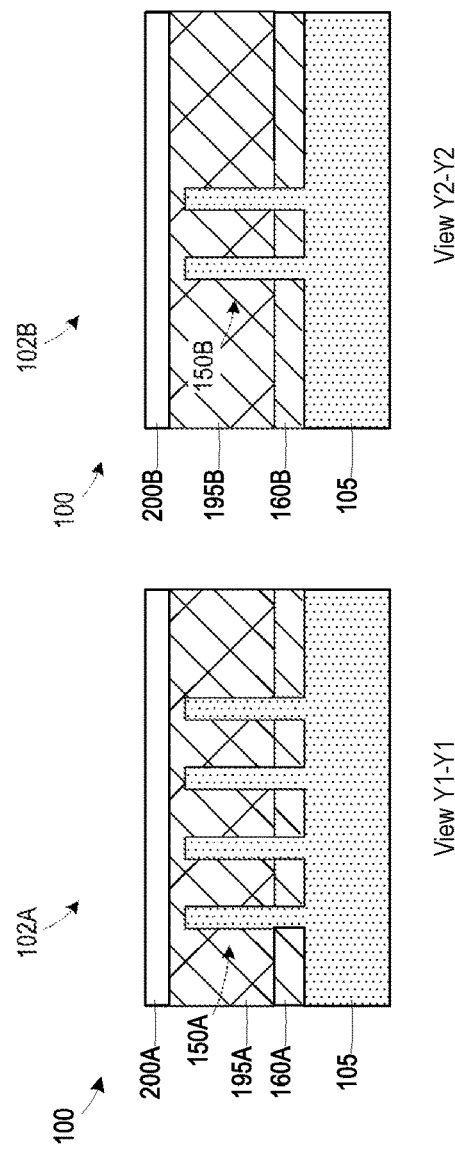

Referring to FIG. 15, the replacement gate structures 195A, 195B are recessed, and cap layers 200A, 200B are formed over the replacement gate structures 195A, 195B, in accordance with some embodiments. In some embodiments, the replacement gate structures 195A, 195B are recessed using an etch process. In some embodiments, the cap layers 200A, 200B are formed using a deposition process. In some embodiments, the cap layers 200A, 200B comprise dielectric materials. In some embodiments, the cap layers 200A, 200B comprise silicon and nitrogen, silicon and oxygen, or other suitable materials. In some embodiments, the cap layers 200A, 200B comprise the same material as the sidewall spacers 175A, 175B.

Figure 16:
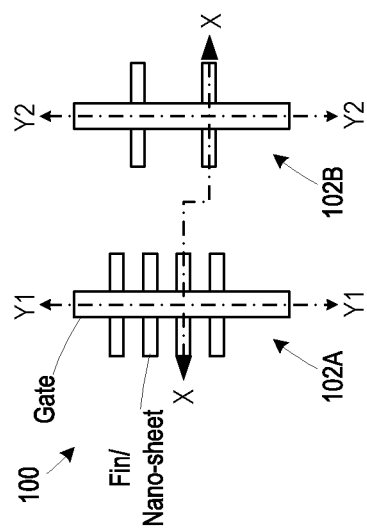
Figure 16:
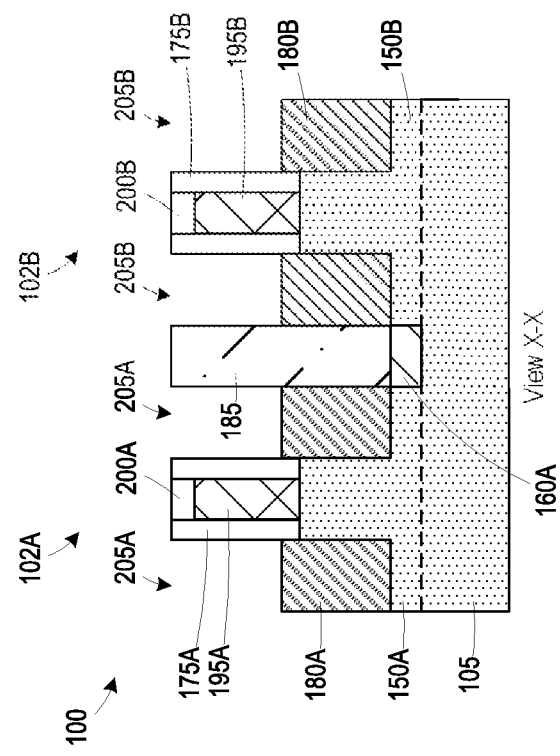

Referring to FIG. 16, contact openings 205A, 205B are formed in the dielectric layer 185 to expose portions of the source/drain regions 180A, 180B, respectively, in accordance with some embodiments. In some embodiments, a patterned etch mask is formed to expose portions of the dielectric layer 185 where the contact openings 205A, 205B are to be formed. In some embodiments, an etch process is performed using the patterned etch mask to remove portions of the dielectric layer 185.

Figure 17:
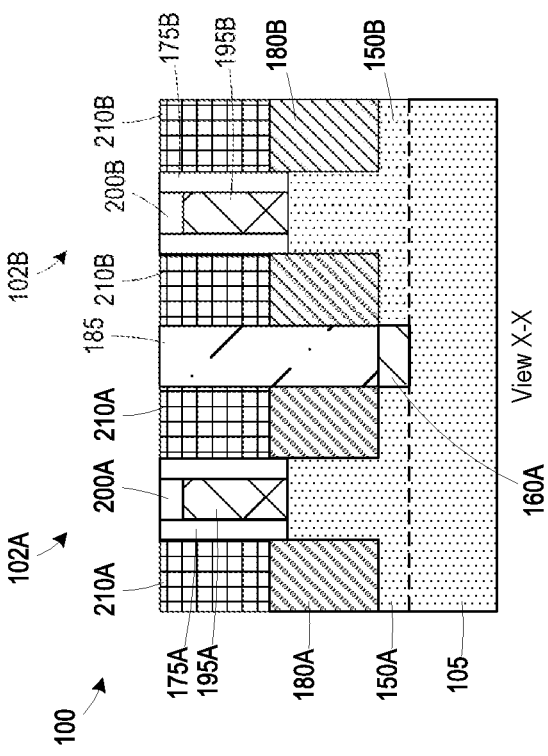

Referring to FIG. 17, source/drain contacts 210A, 210B are formed in the contact openings 205A, 205B, in accordance with some embodiments. In some embodiments, a deposition process is performed to form the source/drain contacts 210A, 210B. In some embodiments, the source/drain contacts 210A, 210B comprise a metal silicide. In some embodiments, source/drain contacts 210A, 210B are line-type structures that extend for substantially the entire length of the active region in a direction that corresponds to the gate width direction of the devices.

Figure 18:
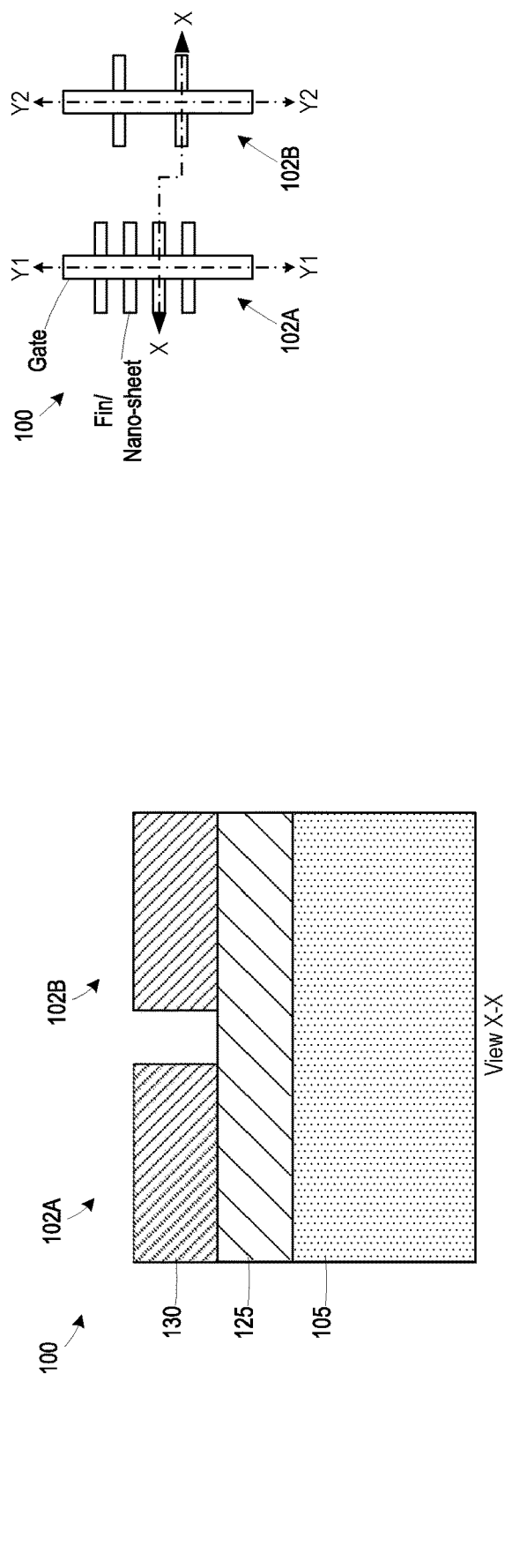
FIG. 18 is an illustration of a semiconductor device after a first patterned mask has been formed, in accordance with some embodiments.

Referring to FIG. 18, another embodiment for forming a semiconductor device 200 is illustrated. The semiconductor device 200 is similar to the semiconductor device 100 illustrated in FIG. 1, except that the first layer 110, the second layer 115, and the third layer 120 are not present. Thus, the fourth layer 125 is formed directly on the semiconductor layer 105. The process described with respect to FIGS. 1-17 may otherwise be similar for forming the semiconductor device 200, and thus the process will not be repeated for brevity.

Figure 19:
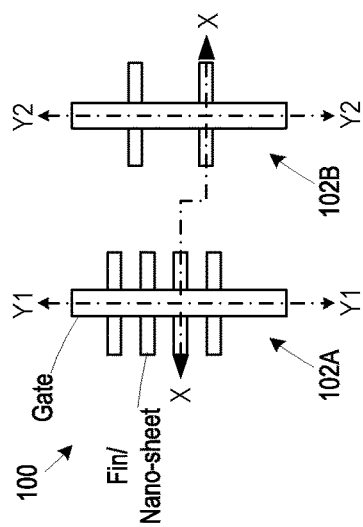
FIG. 19 is an illustration of a semiconductor device after a first patterned mask has been formed, in accordance with some embodiments.
Figure 19:
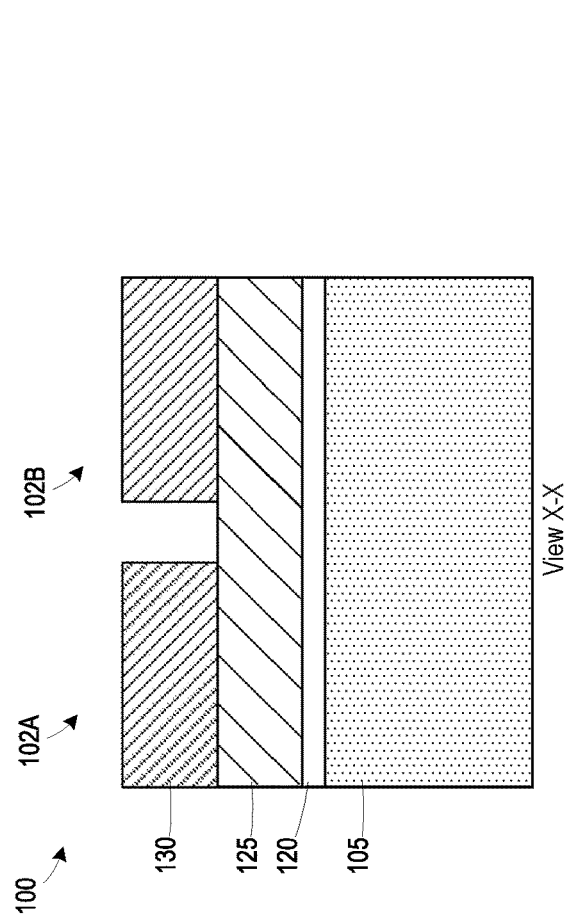
Figure 19:
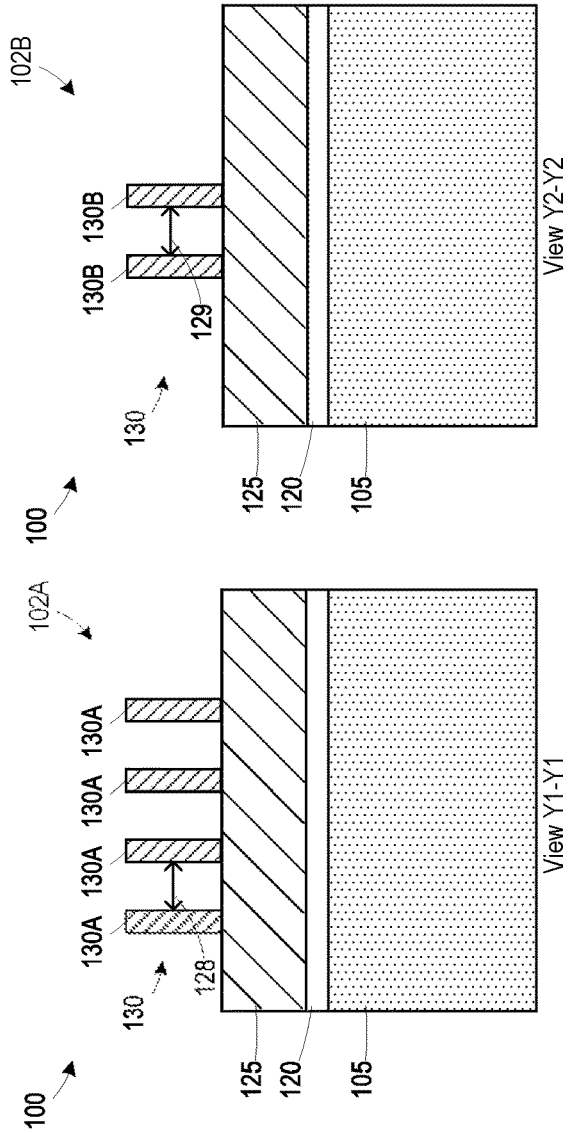

Referring to FIG. 19, another embodiment for forming a semiconductor device 300 is illustrated. The semiconductor device 300 is similar to the semiconductor device 100 illustrated in FIG. 1, except that the first layer 110 and the second layer 115 are not present. Thus, the third layer 120 is formed directly on the semiconductor layer 105. In some embodiments, the third layer 120 functions an etch stop during the cyclic etch process to mitigate the semiconductor layer 105 from being etched during the cyclic etch process. The process described with respect to FIGS. 1-17 may otherwise be similar for forming the semiconductor device 300, and thus the process will not be repeated for brevity.

The use of a cyclic etch process comprising a first phase to form a polymer layer over the first patterned mask and a second phase to remove the polymer layer and to remove a portion of another layer in which a second patterned mask is formed preserves the first patterned mask during the transferring of the pattern to the other layer. Subsequently, the use of the second patterned mask to define fins in a semiconductor layer results in the fins having reduced fin CD variation and tapering and improved line width roughness.

According to some embodiments, a method for forming a semiconductor device is provided. The method includes forming a first layer over a semiconductor layer, forming a first patterned mask over the first layer, and performing a cyclic etch process to define a second patterned mask in the first layer. Each cycle of the cyclic etch process includes a first phase to form a polymer layer over the first patterned mask and a second phase to remove the polymer layer and to remove a portion of the first layer, and during the second phase of each cycle of the cyclic etch process, between about 1 Angstrom and about 20 Angstroms of the first layer is removed. The method also includes removing a portion of the semiconductor layer using the second patterned mask to define a fin from the semiconductor layer.

According to some embodiments, the first phase is performed using a first process gas, and the second phase is performed using a second process gas different than the first process gas.

According to some embodiments, the first process gas includes a fluorocarbon and oxygen.

According to some embodiments, the fluorocarbon is carbon hexafluoride.

According to some embodiments, the second process gas includes argon.

According to some embodiments, the method includes performing a purge phase between the first phase and the second phase.

According to some embodiments, the method includes forming a hard mask layer over the semiconductor layer prior to forming the first layer, and forming the first layer includes forming the first layer over the hard mask layer. The method also includes removing a portion of the hard mask layer using the second patterned mask.

According to some embodiments, the hard mask layer is silicon carbon nitride.

According to some embodiments, the method includes forming a second layer over the hard mask layer prior to forming the first layer, and forming the first layer includes forming the first layer over the second layer. The method also includes terminating the cyclic etch process responsive to exposing the second layer.

According to some embodiments, the second layer includes silicon.

According to some embodiments, the method includes removing a portion of the second layer using the second patterned mask.

According to some embodiments, a method for forming a semiconductor device is provided. The method includes forming a first layer over a semiconductor layer and forming a first patterned mask over the first layer. The first patterned mask includes first elements in a first region and second elements in a second region, and a density of the first elements in the first region is different than a density of the second elements in the second region. The method also includes performing a cyclic etch process including about 120 cycles to about 140 cycles to define a second patterned mask in the first layer. Each cycle of the cyclic etch process includes a first phase to form a polymer layer over the first patterned mask and a second phase to remove the polymer layer and to remove a portion of the first layer. The second patterned mask includes first elements formed from a first portion of the first layer underlying the first elements of the first patterned mask and second elements formed from a second portion of the first layer underlying the second elements of the first patterned mask. The method also includes removing portions of the semiconductor layer using the second patterned mask to define fins from the semiconductor layer. A first subset of the fins are formed from a first portion of the semiconductor layer underlying the first elements of the second patterned mask and a second subset of the fins are formed from a second portion of the semiconductor layer underlying the second elements of the second patterned mask.

According to some embodiments, the first phase is performed using a first process gas, and the second phase is performed using a second process gas different than the first process gas.

According to some embodiments, the first process gas includes oxygen and at least one of a fluorocarbon or methane, and the second process gas includes an inert gas.

According to some embodiments, the first phase is performed using a first bias voltage, and the second phase is performed using a second bias voltage different than the first bias voltage.

According to some embodiments, the first phase is performed using a first plasma power, and the second phase is performed using a second plasma power different than the first plasma power.

According to some embodiments, the method includes performing a purge phase between the first phase and the second phase.

According to some embodiments, a semiconductor device is provided. The semiconductor device includes a first region having a first density of fins and a second region having a second density of fins different than the first density of fins. The second density is about 13% to about 82% of the first density, and a difference between an average height of fins in the first region and an average height of fins in the second region is less than or equal to 1 nanometer.

According to some embodiments, a first fin in the first region is spaced apart from a second fin in the first region by a first distance, and a first fin in the second region is spaced apart from a second fin in the second region by a second distance different than the first distance.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as CVD, for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for forming a semiconductor device, comprising:
    forming a first layer over a semiconductor layer;
    forming a first patterned mask over the first layer;
    performing a cyclic etch process to define a second patterned mask in the first layer, wherein:
        each cycle of the cyclic etch process comprises a first phase to form a polymer layer over the first patterned mask and a second phase to remove the polymer layer and to remove a portion of the first layer, and
        during the second phase of each cycle of the cyclic etch process, between about 1 Angstrom and about 20 Angstroms of the first layer is removed; and
    removing a portion of the semiconductor layer using the second patterned mask to define a fin from the semiconductor layer.

2. The method of claim 1, wherein:
the first phase is performed using a first process gas, and
the second phase is performed using a second process gas different than the first process gas.

3. The method of claim 2, wherein the first process gas comprises a fluorocarbon and oxygen.

4. The method of claim 3, wherein the fluorocarbon is carbon hexafluoride.

5. The method of claim 2, wherein the second process gas comprises argon.

6. The method of claim 1, comprising:
performing a purge phase between the first phase and the second phase.

7. The method of claim 1, comprising:
forming a hard mask layer over the semiconductor layer prior to forming the first layer, wherein forming the first layer comprises forming the first layer over the hard mask layer, and
removing a portion of the hard mask layer using the second patterned mask.

8. The method of claim 7, wherein the hard mask layer is silicon carbon nitride.

9. The method of claim 7, comprising:
forming a second layer over the hard mask layer prior to forming the first layer, wherein forming the first layer comprises forming the first layer over the second layer; and
terminating the cyclic etch process responsive to exposing the second layer.

10. The method of claim 9, wherein the second layer comprises silicon.

11. The method of claim 9, comprising:
removing a portion of the second layer using the second patterned mask.

12. A method for forming a semiconductor device, comprising:
forming a first layer over a semiconductor layer;
forming a first patterned mask over the first layer, wherein:
the first patterned mask comprises first elements in a first region and second elements in a second region, and
a density of the first elements in the first region is different than a density of the second elements in the second region;
performing a cyclic etch process comprising about 120 cycles to about 140 cycles to define a second patterned mask in the first layer, wherein:
each cycle of the cyclic etch process comprises a first phase to form a polymer layer over the first patterned mask and a second phase to remove the polymer layer and to remove a portion of the first layer, and
the second patterned mask comprises first elements formed from a first portion of the first layer underlying the first elements of the first patterned mask and second elements formed from a second portion of the first layer underlying the second elements of the first patterned mask; and
removing portions of the semiconductor layer using the second patterned mask to define fins from the semiconductor layer, wherein a first subset of the fins are formed from a first portion of the semiconductor layer underlying the first elements of the second patterned mask and a second subset of the fins are formed from a second portion of the semiconductor layer underlying the second elements of the second patterned mask.

13. The method of claim 12, wherein:
the first phase is performed using a first process gas, and
the second phase is performed using a second process gas different than the first process gas.

14. The method of claim 13, wherein:
the first process gas comprises oxygen and at least one of a fluorocarbon or methane, and
the second process gas comprises an inert gas.

15. The method of claim 12, wherein the first phase is performed using a first bias voltage, and the second phase is performed using a second bias voltage different than the first bias voltage.

16. The method of claim 15, wherein the first phase is performed using a first plasma power, and the second phase is performed using a second plasma power different than the first plasma power.

17. The method of claim 12, wherein the first phase is performed using a first plasma power, and the second phase is performed using a second plasma power different than the first plasma power.

18. The method of claim 12, comprising:
performing a purge phase between the first phase and the second phase.

19. A method for forming a semiconductor device, comprising:
forming a first layer over a semiconductor layer;
forming a first patterned mask over the first layer, wherein the first patterned mask overlies a first portion of the first layer and does not overlie a second portion of the first layer;
performing a cyclic etch process to define a second patterned mask in the first layer using the first patterned mask, wherein:
each cycle of the cyclic etch process comprises a first phase to form a polymer layer over the second portion of the first layer and a second phase to remove the polymer layer and to remove a portion of the second portion of the first layer, and
during the second phase of each cycle of the cyclic etch process, between about 1 Angstrom and about 20 Angstroms of the second portion of the first layer is removed; and
removing a portion of the semiconductor layer using the second patterned mask to define a fin from the semiconductor layer.

20. The method of claim 19, wherein:
the first phase is performed using a first process gas, and
the second phase is performed using a second process gas different than the first process gas.

* * * * *